United States Patent [19]

Maeda et al.

[11] Patent Number: 5,750,154
[45] Date of Patent: May 12, 1998

[54] RESIN SEALING/MOLDING APPARATUS FOR ELECTRONIC PARTS

[75] Inventors: Keiji Maeda; Yoshihisa Kawamoto, both of Kyoto, Japan

[73] Assignee: Towa Corporation, Uji, Japan

[21] Appl. No.: 738,096

[22] Filed: Oct. 25, 1996

[30] Foreign Application Priority Data

Oct. 30, 1995 [JP] Japan .................................. 7-306910

[51] Int. Cl.[6] .......................... B29C 45/02; B29C 45/14; B29C 45/34
[52] U.S. Cl. .................. 425/116; 425/129.1; 425/544; 425/546; 425/812; 425/DIG. 47; 425/DIG. 60; 425/DIG. 228; 264/272.17; 249/141
[58] Field of Search ........................ 249/141, 170; 425/116, 129.1, 544, 546, 572, 588, DIG. 228, DIG. 47, 420, 812, 190, 192 R, 183, 186, DIG. 60; 264/272.17

[56] References Cited

U.S. PATENT DOCUMENTS

| | | | |
|---|---|---|---|
| 5,196,206 | 3/1993 | Troia et al. | 425/DIG. 60 |
| 5,236,636 | 8/1993 | Tisack | 425/DIG. 60 |
| 5,518,385 | 5/1996 | Graff | 425/DIG. 60 |
| 5,540,576 | 7/1996 | Kawakita et al. | 425/190 |
| 5,603,879 | 2/1997 | Osada et al. | 264/272.17 |

FOREIGN PATENT DOCUMENTS

| | | | |
|---|---|---|---|
| 58-68940 | 4/1983 | Japan | 425/546 |
| 63-149121 | 6/1988 | Japan | 425/DIG. 60 |

*Primary Examiner*—Khanh P. Nguyen
*Attorney, Agent, or Firm*—W. G. Fasse; W. F. Fasse

[57] ABSTRACT

A fixture for fixing an annular upper air isolation member which is provided around an outer side of an upper mold section to an upper mounting plate is released, thereby rotating the air isolation member by a rotational member and fixing the same by a rotational position regulating member. An upper chase unit is exchanged through an upper opening which is defined by the upper mounting plate and the rotated air isolation member. A lower chase unit is also exchanged in a similar manner. Due to this structure, a sealing mechanism for a resin sealing/molding apparatus for electronic parts which can readily and quickly exchange a mold in response to small lot production of various types of products is provided.

8 Claims, 14 Drawing Sheets

5,750,154

RESIN SEALING/MOLDING APPARATUS FOR ELECTRONIC PARTS

BACKGROUND OF THE INVENTION

1. Field of the Invention

The present invention relates to an improvement of a resin sealing/molding apparatus for electronic parts for molding electronic parts such as ICs with a resin material (resin tablet), and more particularly, it relates to an improvement in a sealing mechanism (air isolation mechanism) provided on this molding apparatus.

2. Description of the Background Art

In general, electronic parts are resin-molded by transfer molding, which is generally performed through a resin sealing/molding apparatus for electronic parts in the following manner:

A mold, consisting of a fixed upper mold section and a movable lower mold section, which is previously carried on the aforementioned resin sealing/molding apparatus is heated to a resin molding temperature with heating means, and the upper and lower mold sections are opened.

Then, a lead frame mounting electronic parts is supplied to/set on a prescribed position of a molding surface of the lower molding section, and a resin material is supplied into a pot of the lower mold section.

Then, the lower mold section is upwardly moved so that the upper and lower mold sections are closed. At this time, the electronic parts and the lead frame around the same are engaged/set in upper and lower cavities which are oppositely provided on the molding surfaces of the upper and lower mold sections, while the resin material in the pot is heated and successively melted.

Then, the resin material heated/melted in the pot is pressurized with a plunger to be injected/charged into the upper and lower cavities through a resin passage, whereby the electronic parts and the lead frame around the same provided in the cavities are sealed in a resin molding (mold package) molded in correspondence to the shapes of the cavities.

After a lapse of a time which is necessary for hardening the melted resin material, therefore, the upper and lower mold sections may be opened so that the resin molding and the lead frame as well as the hardened resin are released from the upper and lower cavities and the resin passage respectively by ejector pins.

Foreign matters such as resin flashes remain on the molding surfaces after the resin molding and the like are released and discharged, and hence a cleaning mechanism is advanced into a clearance between the molding surfaces for removing the resin flashes etc. adhering to the molding surfaces (see FIG. 11).

When the upper and lower mold sections are closed as described above, air containing moisture (humidity in the atmosphere or the like, for example) remains at least in an internal space part defined by the aforementioned pot, the resin passage and the upper and lower cavities. This residual air is readily mixed into the melted resin material in resin molding, to form voids (bubbles) in the interior and the exterior of the resin molding.

In order to prevent formation of such voids, a proper sealing mechanism is provided on a required portion of the aforementioned molding apparatus, while a decompression mechanism is provided on the molding apparatus for forcibly sucking/discharging air remaining in an air isolation space part defined by the sealing mechanism. Further, the air isolation space part and the decompression mechanism are communicationally connected with each other by a vacuum path.

Therefore, the electronic parts mounted on the lead frame which is engaged/set in the upper and lower cavities can be molded by isolating at least the internal space part from the outside air with the sealing mechanism and setting at least the interior of the internal space part at a prescribed degree of vacuum.

On the upper side, for example, an upper air isolation member is provided around the outer side of the upper mold section to enclose the same, while the upper mold section and the upper air isolation member are fixed to an upper mounting plate.

On the lower side, on the other hand, a lower air isolation member is provided around the outer side of the lower mold section to enclose the same, while the lower mold section and the lower air isolation member are fixed to a lower mounting plate.

Further, sealing members for sealing the clearance between the air isolation members are provided between engaging surfaces of the air isolation members.

In other words, the sealing members are provided on an outer peripheral wall surface (engaging surface) of the upper air isolation member and an inner peripheral wall surface (engaging surface) of the lower air isolation member respectively (see FIGS. 5A and 5B).

Further, a sealing member such as an O-ring is circumferentially provided on an upper end of the plunger which is engaged in the pot for sealing a clearance between an inner peripheral wall surface of the pot and an outer peripheral wall surface of the upper end of the plunger.

Therefore, it is possible to isolate at least the internal space part from the outside air by closing the mold sections and engaging the air isolation members with each other.

Mold parts of the fixed upper mold section and the movable lower mold section are opposed to each other while the mold part of the movable lower mold section is placed on a vertically moved movable platen.

The mold part of the movable lower mold section is formed by the movable lower mold section, the lower mounting plate, the lower air isolation member, and a space provided with a lower ejector plate for fixing the ejector pin and allowing vertical movement thereof.

The upper end of the plunger is engaged in the pot through insertion holes of the lower mounting plate, the lower ejector plate, and an upper portion of the movable platen.

A plunger holder freely engaged with/supporting the plunger is provided on the base end of the plunger, and this plunger holder is arranged in a space of the movable platen so that the plunger and the plunger holder are vertically reciprocated by a proper vertical reciprocation mechanism (see FIG. 6).

However, the mold (the upper and lower mold sections) carried on the resin sealing/molding apparatus must be frequently exchanged due to the recent tendency for small lot production of various types of products.

In the aforementioned resin sealing/molding apparatus, however, it is necessary to detach the air isolation members which are fixedly arranged respectively, in order to exchange the mold with another one.

Thus, it takes time and labor for exchanging the mold, and hence the mold cannot be readily and quickly exchanged with another one.

As the molding is repeated, on the other hand, resin dregs accumulate in the pot, infiltrate into the clearance between the outer peripheral surface of the upper end of the reciprocatory plunger and the inner peripheral wall surface of the pot, and rub against the sealing member which is arranged on the upper end of the plunger.

Thus, the sealing member is worn or broken by the resin dregs, and hence the sealability between the plunger and the pot is so deteriorated that it is difficult to isolate at least the internal space part consisting of the pot, the resin passage and the cavities from the pot side.

Further, the aforementioned resin dregs fall from the clearance between the pot and the upper end of the plunger, and the falling resin dregs are deposited on the plunger holder etc. through the insertion holes of the lower mounting plate, the lower ejector plate and the upper portion of the movable platen.

Therefore, the deposited resin dregs hinder the vertically moved plunger holder, to inhibit the plunger from the resin pressurizing action through the aforementioned vertical reciprocation mechanism.

While the molding apparatus is stopped and decomposed for removing the deposited resin dregs from its interior, productivity of products (resin moldings) is reduced in this case since a considerable time is necessary for decomposing and assembling the molding apparatus.

Further, the upper end of the lower air isolation member is positioned upward beyond the molding surface of the lower mold section, and hence the air isolation member itself hinders cleaning of the molding surface with the cleaning mechanism while the cleaning mechanism readily collides with and damages the lower air isolation member when the lower mold section is cleaned with the cleaning mechanism.

In addition, the lower end of the upper air isolation member is positioned downward beyond the molding surface of the upper mold section, and hence the cleaning mechanism readily collides with and damages the upper air isolation member, similarly to the case of the lower mold section.

Thus, it is disadvantageously difficult to clean the upper and lower molding surfaces with the cleaning mechanism.

SUMMARY OF THE INVENTION

An object of the present invention is to provide a resin sealing/molding apparatus for electronic parts comprising a proper sealing mechanism for isolating at least an internal space part consisting of a pot, a resin passage and cavities from the outside air.

Another object of the present invention is to provide a resin sealing/molding apparatus for electronic parts comprising a sealing mechanism, which is suitable for small lot production of various types of products and can readily and quickly exchange a mold.

Still another object of the present invention is to provide a resin sealing/molding apparatus for electronic parts comprising a sealing mechanism, which can prevent a plunger from inhibition of its resin pressuring action by resin dregs falling from a clearance between a pot and the plunger while isolating at least an internal space part consisting of the pot, a resin passage and cavities from the pot side.

A further object of the present invention is to automatically remove resin dregs falling from a clearance between a pot and a plunger in a resin sealing/molding apparatus for electronic parts to the exterior while improving productivity for products.

A further object of the present invention is to provide a resin sealing/molding apparatus for electronic parts comprising a sealing mechanism, which can isolate at least an internal space part consisting of a pot, a resin passage and cavities from the outside air while readily cleaning upper and lower molding surfaces.

In order to solve the aforementioned technical problems, a resin sealing/molding apparatus for electronic parts according to one aspect of the present invention includes a fixed mold section, a movable mold section being opposed to the fixed mold section, a pot for supplying a resin material being arranged on at least one of the fixed and movable mold sections, cavities for resin molding being oppositely arranged on the fixed and movable mold sections, a resin passage being provided between the pot and the cavities for transferring a melted resin material, a sealing mechanism for isolating at least an internal space part consisting of the pot, the resin passage and the cavities from the outside air at the time of closing the fixed and movable mold sections, a decompression mechanism for decompressing an air isolation space part being isolated from the outside air through the sealing mechanism, and a vacuums path for communicationally connecting the air isolation space part with the decompression mechanism, and is characterized in that the sealing mechanism is rotatably mounted on at least one of the fixed and movable mold sections, whereby the sealing mechanism is rotated to a position which allows isolation of the internal space part from the outside air at the time of resin sealing/molding the electronic parts, while the sealing mechanism is rotated to a position which does not prevent exchange operation of the fixed and movable mold sections at the time of exchanging the fixed and movable mold sections.

According to the above structure, since the sealing mechanism is arranged to a position which allows isolation of the internal space part from the outside air by the simple rotation operation, resin sealing/molding of the electronic parts can be carried out in this state.

In addition, since the sealing mechanism can be arranged to a position which does not prevent the exchange operation of the fixed and movable mold sections by the simple rotation operation, the exchange operation of the fixed and movable mold sections can be readily carried out in this state.

In order to solve the aforementioned technical problems, a resin sealing/molding apparatus for electronic parts according to another aspect of the present invention includes a fixed mold section, a movable mold section being opposed to the fixed mold section, a pot for supplying a resin material being arranged on at least one of the fixed and movable mold sections, cavities for resin molding being oppositely arranged on the fixed and movable mold sections, a resin passage being provided between the pot and the cavities for transferring a melted resin material, a sealing mechanism for isolating at least an internal space part consisting of the pot, the resin passage and the cavities from the outside air at the time of closing the fixed and movable mold sections, a decompression mechanism for decompressing an air isolation space part being isolated from the outside air through the sealing mechanism, and a vacuum path for communicationally connecting the air isolation space part with the decompression mechanism, and is characterized in that the sealing mechanism is rotatably mounted on each of the fixed and movable mold sections, whereby each sealing mechanism is rotated to a position which allows isolation of the internal space part from the outside air at the time of resin sealing/molding the electronic parts, while each sealing mechanism is rotated to a position which does not prevent exchange operation of the fixed and movable mold sections at the time of exchanging the fixed and movable mold sections.

According to the above structure, since the sealing mechanism can be divided to be reduced in size, workability and operativity are improved, and each sealing mechanism can be arranged to a position which allows isolation of the internal space part from the outside air by the simple rotation operation, whereby resin sealing/molding of the electronic parts can be carried out in this state.

In addition, since any one of or all of the sealing mechanisms can be arranged to a position which does not prevent the exchange operation of the fixed and movable mold sections by the simple rotation operation, the sealing mechanisms can be adapted to the actual exchange operations such as exchange of either one of the fixed and movable mold sections and simultaneous exchange of the fixed and movable mode sections which are carried out for the purpose of maintenance, inspection or the like, whereby workability and operativity thereof are improved.

In order to solve the aforementioned technical problems, a resin sealing/molding apparatus for electronic parts according to still another aspect of the present invention includes an upper mold section, a lower mold section which is opposed to the upper mold section, a pot for supplying a resin material which is arranged on at least one of the upper and lower mold sections, cavities for resin molding which are oppositely arranged on the upper and lower mold sections, a resin passage which is provided between the pot and the cavities for transferring a melted resin material, a plunger for pressurizing resin which is engaged in the pot, an upper mounting plate mounting the upper mold section, a lower mounting plate mounting the lower mold section, a sealing mechanism for isolating at least an internal space part consisting of the pot, the resin passage and the cavities from the outside air, a decompression mechanism for decompressing an air isolation space part which is formed by the sealing mechanism, and a vacuum path for communicationally connecting the air isolation space part with the decompression mechanism, and is characterized in that the upper mold section is formed by an upper base and an upper chase unit which is detachably exchanged with respect to the upper base, the lower mold section is formed by a lower base and a lower chase unit which is detachably exchanged with respect to the lower base, and the sealing mechanism is formed by an upper air isolation member which is provided around the outer side of the upper mold section for enclosing this upper mold section, a lower air isolation member which is provided around the outer side of the lower mold section for enclosing this lower mold section, a first sealing member which is provided on at least one of the upper air isolation member mounted on the upper mounting plate and the upper mounting plate for sealing a clearance therebetween, a second sealing member which is provided on at least one of the lower air isolation member mounted on the lower mounting plate and the lower mounting plate for sealing a clearance therebetween, and a third sealing member which is provided on at least one of engaging surfaces of the upper and lower air isolation members defined in engagement thereof, while the upper mounting plate is provided with an upper rotational member for making the upper air isolation member freely rotatable, an upper rotational position regulating member for regulating and fixing the rotational position of the upper air isolation member and a fixture for fixing the upper air isolation member to the upper mounting plate and the lower mounting plate is provided with a lower rotational member for making the lower air isolation member freely rotatable and a lower rotational position regulating member for regulating the rotational position of the lower air isolation member, so that the upper chase unit is exchanged through an upper opening which is defined by the upper mounting plate and the rotated upper air isolation member and the lower chase unit is exchanged through a lower opening which is defined by the lower mounting plate and the rotated lower air isolation member by releasing the fixture.

According to the above structure, at least the internal space part of the mold consisting of the pot, the resin passage and the cavities provided between the upper and lower mold sections can be isolated from the outside air by the upper and lower air isolation members which are provided around the outer sides of the upper and lower mold sections to enclose these sections respectively.

When the upper air isolation member is rotated on the upper side, the upper chase unit can be detachably exchanged with respect to the upper base through the upper opening which is defined by the rotated upper air isolation member and the upper mounting plate mounting the upper mold section.

When the lower air isolation member is rotated on the lower side, on the other hand, the lower chase unit can be detachably exchanged with respect to the lower base through the lower opening which is defined by the rotated lower air isolation member and the lower mounting plate mounting the lower mold section.

In a preferred embodiment of the inventive resin sealing/molding apparatus for electronic parts, the third sealing member is provided on at least one of parting line surfaces of the upper and lower air isolation members.

The inventive resin sealing/molding apparatus for electronic parts is, in another preferred embodiment, characterized in that the upper and lower air isolation members are coupled with each other by a coupling member, while the lower air isolation member is suspended by the coupling member thereby defining the lower opening.

In a further preferred embodiment of the inventive resin sealing/molding apparatus for electronic parts, a hollow sealing member is provided as the third sealing member on at least one of parting line surfaces of the upper and lower air isolation members.

A resin sealing/molding apparatus for electronic parts according to a further aspect of the present invention for solving the aforementioned technical problems includes an upper mold section, a lower mold section which is opposed to the upper mold section, a pot which is provided on the lower mold section for supplying a resin material, cavities for resin molding which are oppositely provided on the upper and lower mold sections, a resin passage which is provided between the pot and the cavities for transferring a melted resin material, a plunger which is engaged in the pot for pressurizing resin, an upper mounting plate mounting the upper mold section, a lower mounting plate mounting the lower mold section, an insertion hole of the lower mounting plate for receiving the plunger, a vertical reciprocation mechanism for vertically moving the plunger, a sealing mechanism for isolating at least an internal space part consisting of the pot, the resin passage and the cavities from the outside air, a decompression mechanism for decompressing an air isolation space part which is formed by the sealing mechanism, and a vacuum path communicationally connecting the air isolation space part with the decompression mechanism, and is characterized in that a storage part is provided in the insertion hole of the lower mounting plate for storing resin dregs falling from a clearance between the pot and an upper end of the plunger and the sealing mechanism on the pot side is formed by providing a sealing member in the insertion hole of the lower mounting plate for sealing a clearance between the storage part and the insertion hole of the lower mounting plate, while an air blowing mechanism and an air discharge mechanism are provided for blowing compressed air into the storage part having deposited resin dregs and discharging air from the storage part respectively.

According to the above structure, the storage part is provided in the insertion hole of the lower mounting plate mounting the lower mold while the sealing member is provided in the insertion hole of the lower mounting plate for sealing the clearance between the storage part and the insertion hole of the lower mounting plate, whereby resin dregs falling from the clearance between the pot of the lower mold section and the upper end of the plunger which is engaged in the pot can be stored in the storage part, while at least the internal space part of the mold consisting of the pot, the resin passage and the cavities can be isolated from the pot side.

Further, the inventive apparatus is provided with the air blowing mechanism for blowing compressed air into the storage part having deposited resin dregs and the air discharge mechanism for discharging air from the storage part, whereby the resin dregs can be automatically removed from the storage part to the exterior of the resin sealing/molding apparatus by the air blowing mechanism and the air discharge mechanism.

A resin sealing/molding apparatus for electronic parts according to a further aspect of the present invention for solving the aforementioned technical problems includes a fixed mold section, a movable mold section which is opposed to the fixed mold section, a pot which is provided on at least one of the fixed and movable mold sections for supplying a resin material, cavities for resin molding provided on the fixed and movable mold sections, a resin passage which is provided between the pot and the cavities for transferring a melted resin material, a plunger which is engaged in the pot for pressurizing resin, a sealing mechanism for isolating at least an internal space part consisting of the pot, the resin passage and the cavities which is defined between the mold sections, a decompression mechanism for decompressing an air isolation space part which is formed by the sealing mechanism, and a vacuum path for communicationally connecting the air isolation space part with the decompression mechanism, and is characterized in that the sealing mechanism is formed by engaging a soft air isolation member around the outer side of one of the fixed and movable mold sections while engaging a sealing block around the outer side of the other mold section to be connected in correspondence to the soft air isolation member in closure of the mold sections.

According to the above structure, the soft air isolation member is engaged around the outer side of either one of the fixed and movable mold sections while the sealing block corresponding to the soft air isolation member is engaged around the outer side of the other mold section, whereby the soft air isolation member and the sealing block can be connected with each other so that at least the internal space part consisting of the pot, the resin passage and the cavities can be covered from the peripheries of the outer sides of the mold sections to be isolated from the outside air at the time of closing the fixed and movable mold sections.

In case of cleaning the mold surfaces, further, the forward end portion of the soft air isolation member can be moved at least to a position not hindering the cleaning mechanism advancing between the molding surfaces.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1A:
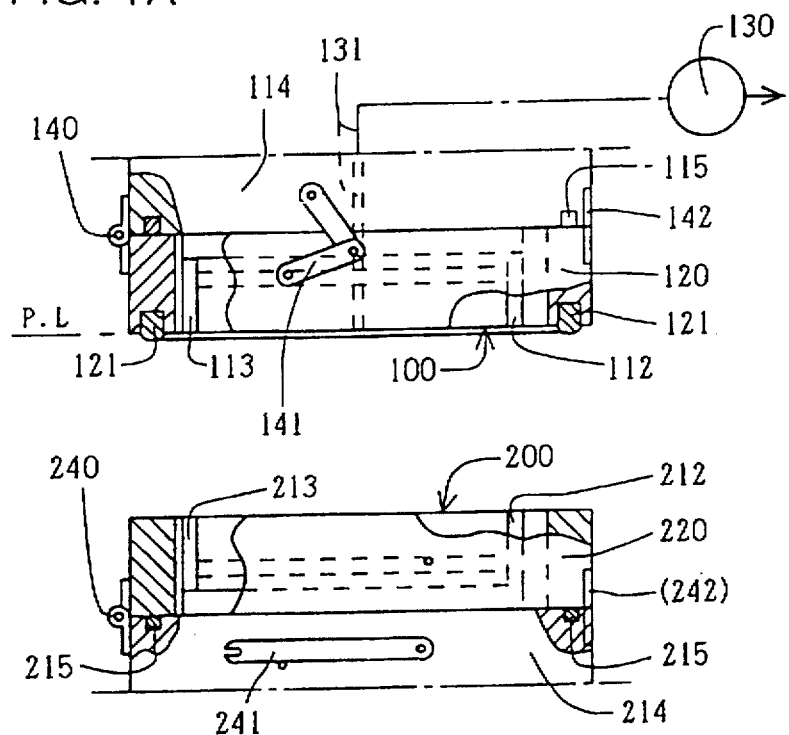
FIG. 1A is a partially fragmented front elevational view schematically showing an exemplary overall structure of a resin sealing/molding apparatus according to an embodiment of the present invention which is provided with a mold.

The present invention is now described in detail with reference to the drawings showing embodiments thereof.

An embodiment shown in FIGS. 1A, 1B, 2A and 2B is described.

A resin sealing/molding apparatus shown in FIGS. 1A, 1B, 2A and 2B carries a mold consisting of a fixed upper mold section 100 and a movable lower mold section 200 which is opposed to the fixed upper mold section 100.

A single or a plurality of pots (not shown) for supplying a resin material and a plunger (not shown) engaged in the pot(s) for pressurizing resin are provided on at least one of the upper and lower mold sections 100 and 200.

Further, cavities 101 for resin molding are oppositely provided on molding surfaces of the upper and lower mold sections 100 and 200, for example, for engaging/setting electronic parts which are mounted on a lead frame, while a resin passage 102 is provided between the pot(s) (not shown) provided on the lower mold section 200 and the upper and lower cavities 101 for transferring a melted resin material.

Therefore, the melted resin material in the pot(s) is pressurized with the plunger, thereby injecting/charging the melted resin material into the respective cavities 101 through the resin passage 102 while resin-molding the electronic parts engaged/set in the respective cavities 101.

In the upper mold section 100, an upper chase unit 110 is detachably formed with respect to an upper base 111 by a sort of dovetail engagement, while this upper chase unit 110 is fixed to the upper base 111 from both sides by fixed blocks 112 and 113.

In the lower mold section 220, on the other hand, a lower chase unit 210 is detachably formed with respect to a lower base 211 by a sort of dovetail engagement, while this lower chase unit 210 is fixed to the lower base 211 from both sides by fixed blocks 212 and 213, similarly to the upper mold section 100.

Therefore, the chase units 110 and 210 can be exchanged by removing the fixed blocks 112 and 212 and taking out the chase units 110 and 210 from the bases 111 and 211 respectively and mounting new chase units 110 and 210 on the bases 111 and 211 while fixing the former to the latter by the fixed blocks 112 and 212 in the upper and lower mold sections 100 and 200 respectively.

Figure 2A:
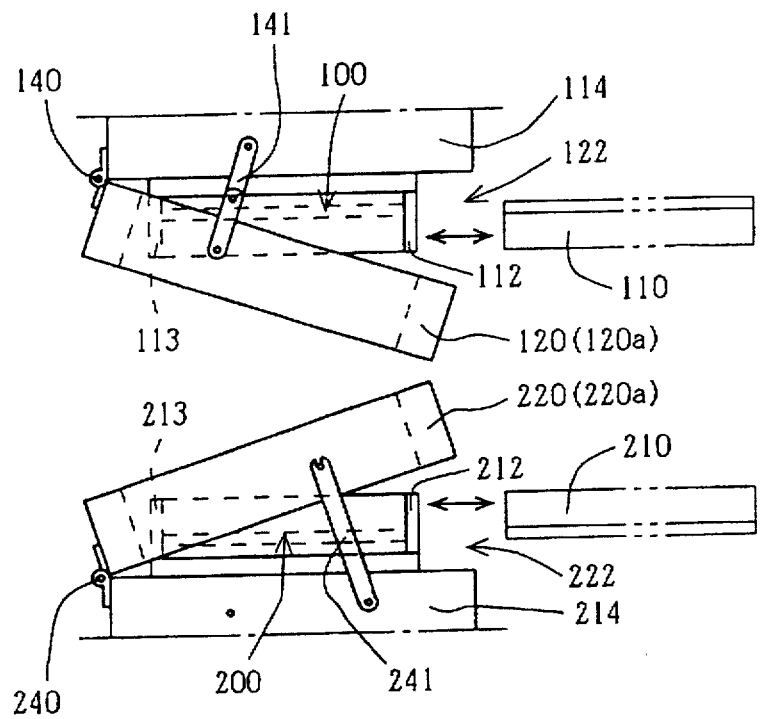
FIG. 2A is a schematic front elevational view of a sealing mechanism in the molding apparatus shown in FIG. 1A in a state of exchanging the mold.
Figure 2B:
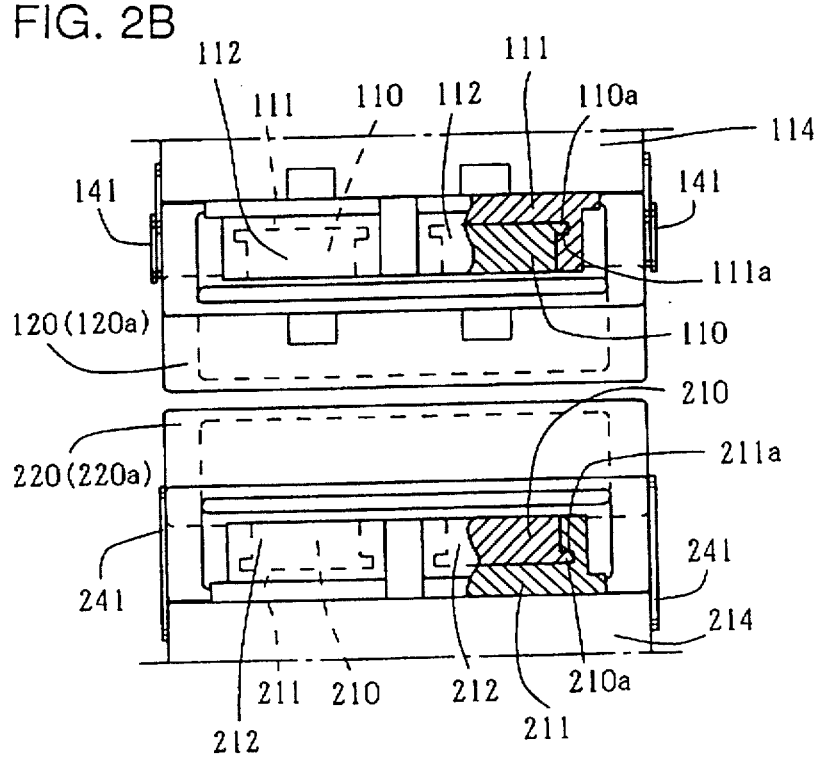
FIG. 2B is a schematic side elevational view of the molding apparatus shown in FIG. 2A.

As shown in FIG. 2B, the chase units 110 and 210 are provided with dovetail parts 110a and 210a respectively, while the bases 111 and 211 are provided with dovetail grooves 111a and 211a corresponding to the dovetail parts 110a and 210a respectively.

The molding apparatus is further provided with a proper sealing mechanism for isolating at least an internal space part of the mold consisting of the pot(s), the resin passage 102 and the cavities 101 from the outside air.

Namely, upper and lower air isolation members 120 and 220 (sealing mechanism) provided in annular forms such as cylindrical or tubular forms are provided around the outer sides of the upper and lower mold sections 100 and 200 to enclose the same respectively.

Further, a required number of proper sealing members such as O-rings are provided on required portions of the molding apparatus.

The upper mold section 100 and the upper air isolation member 120 are mounted on an upper mounting plate 114, while the lower mold section 200 and the lower air isolation member 220 are mounted on a lower molding plate 214.

Namely, a proper sealing member 115 such as the aforementioned O-ring is provided on at least one of the upper mounting plate 114 and the upper air isolation member 120 for sealing a clearance therebetween, while a proper sealing member 215 such as the aforementioned O-ring is provided on at least one of the lower mounting plate 214 and the lower air isolation member 220 for sealing a clearance therebetween.

Further, a proper sealing member such as an O-ring is provided on at least one of contact surfaces of the upper and lower air isolation members 120 and 220 in closure of the upper and lower mold sections 100 and 200.

As shown in the figures, the upper and lower air isolation members 120 and 220 are connected with each other on parting line (PL) surfaces provided on forward end portions thereof when the upper and lower mold sections 100 and 200 are closed, while a proper sealing member 121 such as an O-ring is provided on the PL surface (contact surface) of the upper air isolation member 120.

When the upper and lower mold sections 100 and 200 are closed, therefore, the air isolation members 120 and 220 are connected with each other on the PL surfaces thereby defining an air isolation space part by the air isolation members 120 and 220 and the mounting plates 114 and 214, while at least the internal space part of the mold consisting of the pot(s), the resin passage 102 and the cavities 101 can be isolated from the outside air from the outer peripheral sides of the upper and lower mold sections 100 and 200.

Figure 1B:
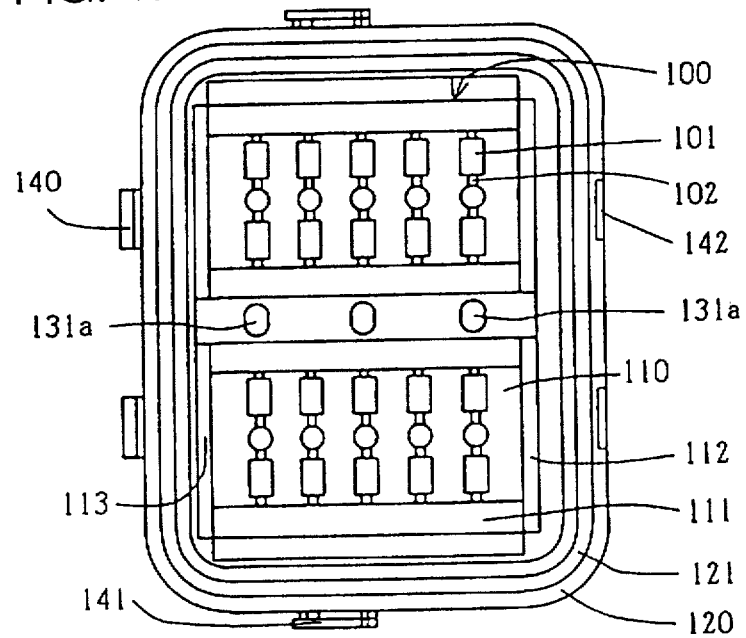
FIG. 1B is a bottom plan view showing a molding surface of an upper mold section provided on the molding apparatus shown in FIG. 1A.

The molding apparatus is further provided with a decompression mechanism 130 such as a vacuum pump for forcibly sucking/discharging air etc. remaining in the interior of the air isolation space part, while this decompression mechanism 130 is communicationally connected with the air isolation space part through a vacuum path 131 such as a vacuum hose. As shown in FIG. 1B, a required number of exhaust ports 131a of the vacuum path 131 are provided on the molding surface of the upper mold section 100.

When the lower mold section 200 is upwardly moved, the sealing member 121 provided on the PL surface of the upper air isolation member 120 is brought into contact with the PL surface of the lower air isolation member 220, while the air etc. remaining at least in the internal space part can be forcibly sucked/discharged by the decompression mechanism 130.

Therefore, it is possible to resin-mold electronic parts which are mounted on a lead frame in the upper and lower cavities 101 by connecting the air isolation members 120 and 220 with each other on the PL surfaces thereof for isolating at least the internal space part from the outside air while setting at least the internal space part at a prescribed degree of vacuum by the decompression mechanism 130.

On the upper side, the upper mounting plate 114 is provided with a rotational member 140 such as a hinge for rotating the upper air isolation member 120, an upper rotational position regulating member 141 for regulating and fixing the air isolation member 120 to a prescribed rotational position, and a fixture 142 for fixing and mounting the air isolation member 120 to and on the upper mounting plate 114.

As shown in FIG. 2A, an upper opening 122 can be defined between the air isolation member 120 (120a) and the upper mounting plate 114 by rotating the air isolation member 120 toward the lower mold section 200 while releasing the fixture 142 and fixing this air isolation member 120 by the rotational position regulating member 141.

Thus, it is possible to take out the upper chase unit 110 from the upper base 111 through the opening 122, while mounting a new upper chase unit 110 on the upper base 111 through the opening 122.

On the lower side, on the other hand, the lower mounting plate 214 is provided with a rotational member 240 such as a hinge for rotating the lower air isolation member 220 and a lower rotational position regulating member 241 for regulating and fixing the air isolation member 220 to a prescribed rotational position, similarly to the upper side.

As shown in FIG. 2A, a lower opening 222 can be defined between the air isolation member 220 (220a) and the lower mounting plate 214 by rotating the air isolation member 220 toward the upper mold section 100 and fixing the same by the rotational position regulating member 241.

Thus, it is possible to take out the lower chase unit 210 from the lower base 211 through the opening 222, while mounting a new lower chase unit 210 on the lower base 211 through the opening 222.

On the lower side, it is possible to employ a structure of providing a fixture 242 for fixing the lower air isolation member 220 to the lower mounting plate 214.

Therefore, the fixture 142 is first released to rotate the upper air isolation member 120 on the upper side while this air isolation member 120 is fixed by the rotational position regulating member 141 to define the upper opening 122, so that the upper chase unit 110 is exchanged through this opening 122.

Then, the upper rotational position regulating member 141 is released to rotate and return the upper air isolation member 120 to the original position, while this air isolation member 120 is fixed to/mounted on the upper mounting plate 114 by the fixture 142.

Then, the lower air isolation member 220 is rotated and fixed by the rotational position regulating member 241 on the lower side for defining the opening 222, so that the lower chase unit 210 is exchanged through the opening 222.

Then, the rotational position regulating member 241 is released to rotate the air isolation member 220, while this air isolation member 220 is returned to its original position and mounted on the lower mounting plate 214, so that next resin molding can be started.

Thus, the chase units 110 and 210 can be readily and quickly exchanged with respect to the bases 111 and 211 through the openings 122 and 222 in the respective ones of the upper and lower mold sections 100 and 200.

Figure 3A:
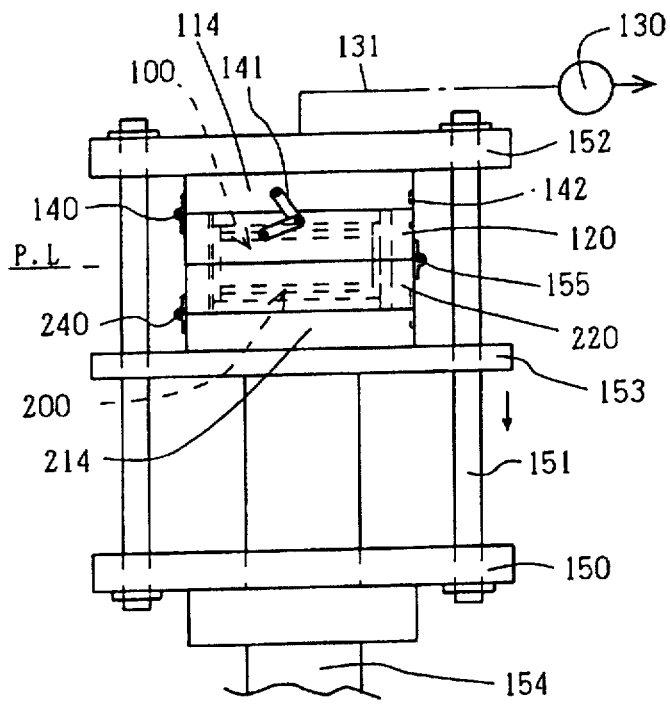
FIGS. 3A and 3B are front elevational views schematically showing an exemplary overall structure of a resin sealing/molding apparatus according to another embodiment of the present invention, illustrating states of mounting a mold and exchanging the mold respectively.
Figure 3B:
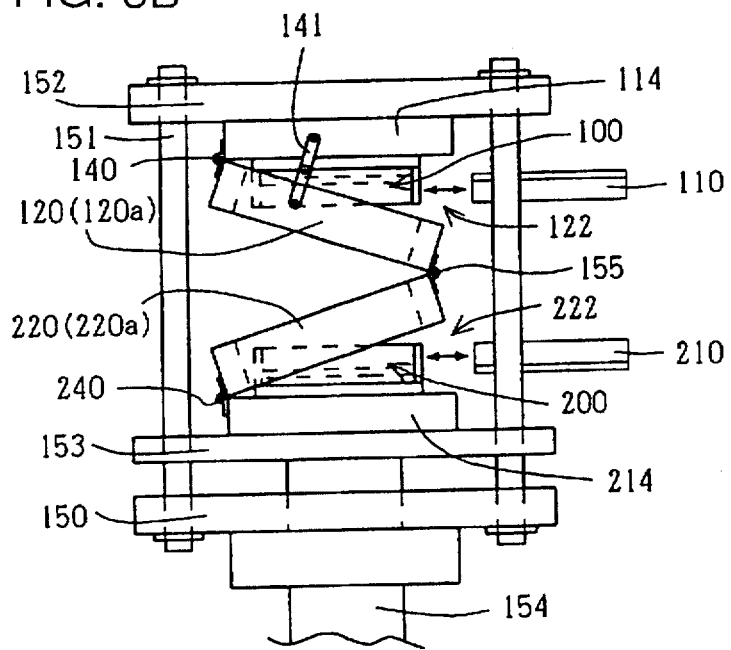

An embodiment shown in FIGS. 3A and 3B is now described.

Basic components for a mold etc. in a resin sealing/molding apparatus shown in FIGS. 3A and 3B are identical to those of the resin sealing/molding apparatus shown in FIGS. 1A, 1B, 2A and 2B, and hence these components are denoted by the same reference numerals.

The resin sealing/molding apparatus shown in FIGS. 3A and 3B carries a mold consisting of a fixed upper mold section 100 and a movable lower mold section 200 which is opposed to the fixed upper mold section 100.

Further, the resin sealing/molding apparatus is formed by a fixed platen 152 which is fixed to upper ends of a required number of tie bars 151 uprightly provided on a base 150, a movable platen 153 vertically slidably engaged with the tie bars 151, an upper mold part for the upper mold section 100 mounted on the fixed platen 152, and a lower mold part for the lower mold section 200 mounted on the movable platen 153.

For example, the upper mold part is formed by the upper mold section 100, an annular upper air isolation member 120 which is provided around the outer side of the upper mold section 100 to enclose the same, and an upper mounting plate 114 mounting the upper mold section 100 and the upper air isolation member 120, while the lower mold part is formed by the lower mold section 200, an annular lower air isolation member 200 which is provided around the outer side of the lower mold section 200 to enclose the same, and a lower mounting plate 214 mounting the lower mold section 200 and the lower air isolation member 200.

As shown in FIGS. 3A and 3B, the upper mold section 100 is mounted on the fixed platen 152 through the upper mounting plate 114, while the lower mold section 200 is mounted on the movable platen 153 through the lower mounting plate 214.

The movable platen 153 is vertically movable by a mold switching mechanism 154 utilizing a hydraulic, pneumatic or electric motor provided on the base 150, whereby the lower mold section 200 side, i.e., the lower mold 200, the lower air isolation member 220 and the lower mounting plate 214 can be integrally vertically moved by the mold switching mechanism 154.

When the lower side is upwardly moved by the mold switching mechanism 154, therefore, the upper and lower mold sections 100 and 200 can be so closed as to connect the air isolation members 120 and 220 with each other on PL surfaces thereof.

Similarly to the aforementioned embodiment, the resin sealing/molding apparatus shown in FIGS. 3A and 3B is further provided with a decompression mechanism 130 for forcibly sucking/discharging air etc. remaining in at least an internal space part consisting of a pot, a resin passage and cavities, an upper chase unit 110 of the upper mold section 100, a lower chase unit 210 of the lower mold section 200, a proper sealing member 121 such as an O-ring provided on the PL surface of the upper air isolation member 120, a rotational member 140 for rotating the upper air isolation member 120, a rotational position regulating member 141 for regulating and fixing the rotational position of the upper air isolation member 120, a fixture 142 for fixing the upper air isolation member 120 to the upper mounting plate 114, and a rotational member 240 for rotating the lower air isolation member 220.

As shown in FIGS. 3A and 3B, further, a required number of proper coupling members 155 are provided on the upper air isolation member 120 for coupling this member 120 with the lower air isolation member 200, so that these coupling members 155 couple the upper and lower air isolation members 120 and 220 with each other when the chase units 110 and 210 are exchanged in the upper and lower mold sections 100 and 200.

First, the lower side is upwardly moved by the mold switching mechanism 154 for closing the upper and lower mold sections 100 and 200 as shown in FIG. 3A while connecting the air isolation members 120 and 220 with each other on the PL surfaces thereof, so that the air isolation members 120 and 220 are coupled with each other by the coupling members 155.

Then, the fixture 142 for the upper air isolation member 120 is released to downwardly move the lower side while rotating the upper air isolation member 120, as shown in FIG. 3B.

At this time, the upper air isolation member 120 is fixed by the rotational position regulating member 141 while an upper opening 122 is defined by the rotated upper air isolation member 120 (120a) and the upper mounting plate 114, similarly to the aforementioned embodiment.

Therefore, it is possible to take out the upper chase unit 110 through the opening 122 while mounting a new upper chase unit 110 on the upper mold section 100, similarly to the aforementioned embodiment.

At this time, the lower air isolation member 220 is suspended by the coupling members 155 provided on the rotated upper air isolation member 120 (120a) on the lower side, thereby defining a lower opening 222.

In the lower mold section 200, therefore, it is possible to take out the lower chase unit 210 through the opening 222 while mounting a new lower chase unit 210, similarly to the aforementioned embodiment.

Then, the lower side is upwardly moved to close the upper and lower mold sections 100 and 200.

Then, the upper air isolation member 120 is fixed to the upper mounting plate 114 with the fixture 142, while the upper and lower air isolation members 120 and 220 are released from the coupling by the coupling members 155.

At this time, the lower air isolation member 220 is mounted on the lower mounting plate 214.

In the respective ones of the upper and lower mold sections 100 and 200, therefore, the upper and lower openings 122 and 22 can be substantially simultaneously defined for readily and quickly exchanging the chase units 110 and 210, while next resin molding can be started.

The lower opening 222 can be defined by suspending the rotated lower air isolation member 220 (220a) by the coupling members 155, so that the lower chase unit 210 can be readily and quickly exchanged through this opening 222.

Namely, it is possible to employ a structure of downwardly moving the lower side while mounting the upper air isolation member 120 on the upper mounting plate 114 with the fixture 142, suspending the lower air isolation member 220 by the coupling members 115, defining the lower opening 222 and exchanging the lower chase unit 210, and then releasing the fixture 142 for defining the upper opening 122 thereby exchanging the lower chase unit 210.

Therefore, it is possible to successively define the upper and lower openings 122 and 222, while the chase units 110 and 210 can be readily and quickly exchanged.

In this case, the distance for downwardly moving the movable platen 153 carrying the mold part for the lower mold section 200 from the position for closing the mold sections 100 and 200 is reduced as compared with the case of substantially simultaneously defining the openings 122 and 222.

While the lower mold section 200 side is downwardly moved to define the openings 122 and 222 in the embodiment shown in FIGS. 3A and 3B, it is possible to employ a structure of alternatively upwardly moving the upper mold section 100 side for defining the openings 122 and 222.

For example, the upper and lower air isolation members 120 and 220 are coupled with each other by the coupling members 115 and the upper mold section 100 side is upwardly moved to define the lower opening 222 for exchanging the lower chase unit 210, and then the fixture 142 is released to define the upper opening 122, so that the upper chase unit 110 can be exchanged.

Figure 4:
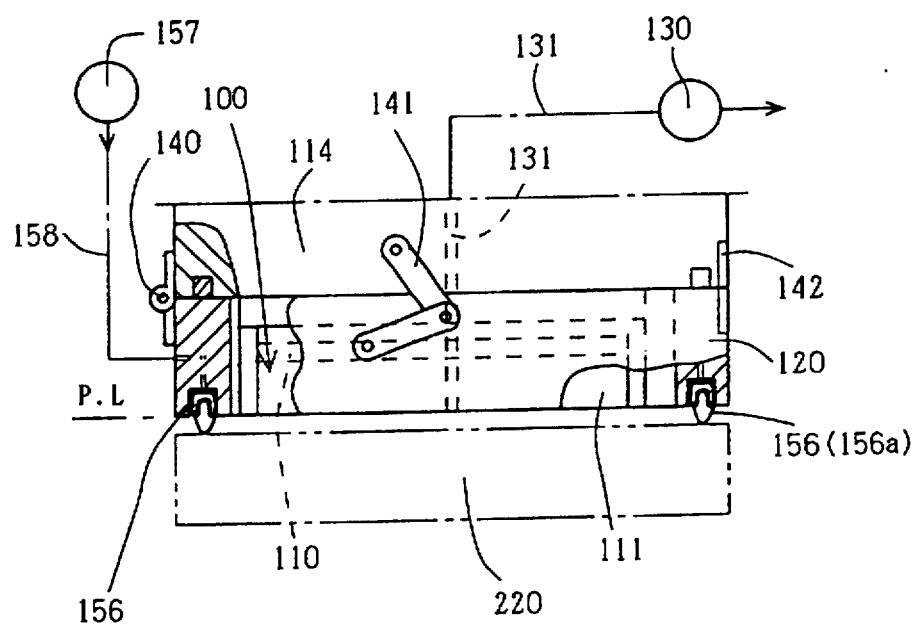
FIG. 4 is a partially fragmented front elevational view schematically showing a resin sealing/molding apparatus according to still another embodiment of the present invention, in a state provided with a mold.

An embodiment shown in FIG. 4 is now described.

In the embodiment shown in FIG. 4, a tubular hollow sealing member 156 consisting of expandable heat-resistant rubber or the like is provided in place of the sealing member 121 such as an O-ring provided on the PL surface of at least one of the upper and lower air isolation members 120 and 220 in the aforementioned embodiment.

In a resin sealing/molding apparatus shown in FIG. 4, the hollow sealing member 156 is provided on a PL surface of an upper air isolation member 120.

Further, the molding apparatus is provided with a pressurizing mechanism 157 for expanding the hollow sealing member 156 by pressurizing its interior, and this pressurizing mechanism 157 is connected with the hollow sealing member 156 through a pressurizing path 158.

When the hollow sealing member 156 is expanded by the pressurizing mechanism 157, the expanded hollow sealing member 156 (156a) projects from the PL surface of the upper air isolation member 120, as shown in FIG. 4.

When the expanded hollow sealing member 156 (156a) is brought into contact with a PL surface lower air isolation member 220 as shown in FIG. 4, it is possible to forcibly suck/discharge air etc. from at least an internal space part consisting of a pot, a resin passage and cavities, which is formed between upper and lower mold sections 100, by a decompression mechanism 130 while closing the upper and lower mold sections 100 for resin-molding electronic parts, similarly to the aforementioned embodiment.

In the resin sealing/molding apparatus shown in FIG. 4, it is possible to define an upper opening 122 by rotating the upper air isolation member 120 while fixing this upper air isolation member 120 with a rotational position regulating member 141 thereby exchanging an upper chase unit 110 through the opening 122, similarly to the aforementioned embodiments.

On the lower side, further, a lower chase unit 210 can be exchanged in a similar manner to the upper side.

Figure 5A:
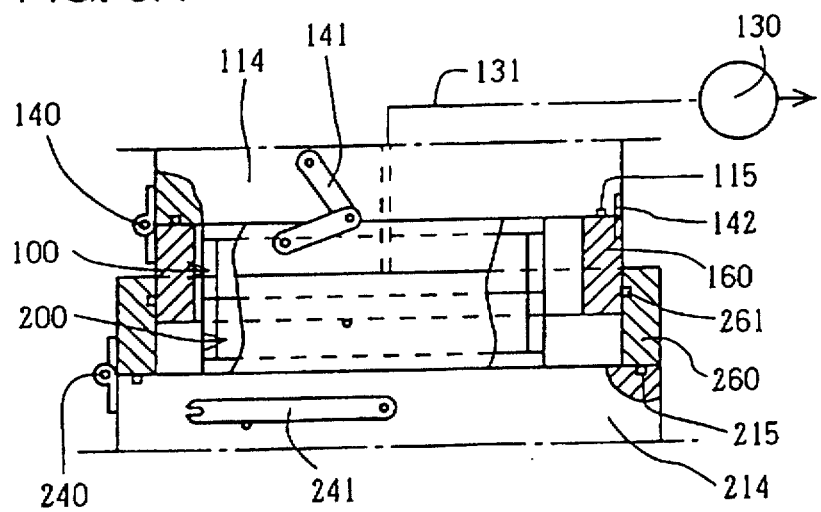
FIG. 5A is a partially fragmented front elevational view schematically showing a further embodiment of the present invention in a state provided with a mold.
Figure 5B:
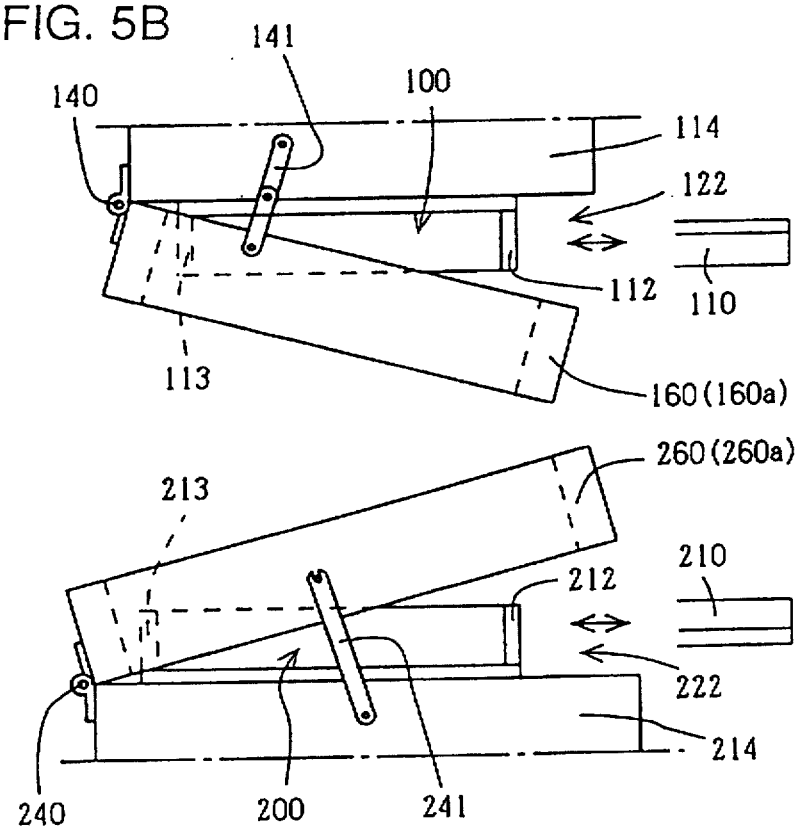
FIG. 5B is a partially fragmented front elevational view corresponding to FIG. 5A, showing a state of exchanging the mold.

An embodiment shown in FIGS. 5A and 5B is now described.

Basic components for a mold etc. in a resin sealing/molding apparatus shown in FIGS. 5A and 5B are identical to those of the aforementioned embodiments, and hence these components are denoted by the same reference numerals.

As shown in FIG. 5A, upper and lower air isolation members 160 and 260 of annular forms or the like are provided around the outer sides of a fixed upper mold section 100 and a movable lower mold section 200 to enclose the same respectively.

The upper and lower air isolation members 160 and 260 are engaged with each other when the upper and lower mold sections 100 and 200 are closed.

When the upper and lower air isolation members 160 and 260 are engaged with each other, outer and inner peripheral wall surfaces of these upper and lower air isolation members 160 and 260 are brought into contact/engaged with each other to define engaging surfaces (contact surfaces) respectively.

Further, a proper sealing member such as an O-ring is provided on at least one of the engaging surfaces of the air isolation members 160 and 260.

Namely, a sealing member 261 is provided on the lower air isolation member 260, as shown in FIG. 5A.

Therefore, at least an internal space part consisting of a pot, a resin passage and cavities which is defined between the upper and lower mold sections 100 and 200 in engagement of the air isolation members 160 and 260 can be isolated from the outside air, and electronic parts can be resin-molded while setting at least the internal space part at a prescribed degree of vacuum by a decompression mechanism 130 through a vacuum path 131, similarly to the aforementioned embodiments.

As shown in FIGS. 5A and 5B, further, it is possible to rotate the upper air isolation member 160 on the upper mold section 100 side with a rotational member 140 by releasing a fixture 142 while fixing the air isolation member 160 with a rotational position regulating member 141 and defining an upper opening 122 by the rotated upper air isolation member 160 (160a) and an upper mounting plate 114 thereby exchanging an upper chase unit 110 through the opening 122.

In the lower mold section 200, on the other hand, it is possible to rotate the lower air isolation member 260 with a rotational member 240 while fixing the air isolation member 260 with a rotational position regulating member 241 and defining a lower opening 222 by the rotated lower air isolation member 260 (260a) and a lower mounting plate 214 thereby exchanging a lower chase unit 210 through the opening 222.

In the embodiment shown in FIGS. 5A and 5B, therefore, the respective chase units 110 and 210 can be readily and quickly exchanged, similarly to the aforementioned embodiments.

Similarly to the aforementioned embodiments, further, it is possible to employ a structure of coupling the upper and lower air isolation members 160 and 260 shown in FIGS. 5A and 5B with each other by a coupling member 155 and defining the openings 122 and 222.

Further, it is possible to employ a structure of providing a hollow sealing member 156 on at least one of outer and inner peripheral surfaces (engaging surfaces) of the upper and lower air isolation members 160 and 260.

Note that in the above-mentioned embodiments shown in FIGS. 1A to 5B, the sealing mechanism is rotatably mounted on each of the fixed and movable mold sections, whereby each sealing mechanism is rotated to a position which allows isolation of an internal space part from the outside air at the time of resin sealing/molding electronic parts, while each sealing mechanism is rotated to a position which does not prevent exchange operation of the fixed and movable mold sections at the time of exchanging the fixed and movable mold sections.

Therefore, according to such a structure, since the sealing mechanism can be divided to be reduced in size, workability and operativity thereof are improved, and each sealing mechanism can be arranged to a position which allows isolation of the internal space part from the outside air by the simple rotation operation, whereby resin sealing/molding of the electronic parts can be carried out in this state.

In addition, since any one of or all of the sealing mechanisms can be arranged to a position which prevents the exchange operation of the fixed and movable mold sections from being inhibited by the simple rotation operation, the sealing mechanism can be adapted to the actual exchange operations such as exchange of either one of the fixed and movable mold sections and simultaneous exchange of the fixed and movable mold sections which are carried out for the purpose of maintenance, inspection or the like, whereby workability and operativity thereof are improved.

However, if the overall resin sealing/molding apparatus for electronic parts is small, for example, it is possible to employ a structure in which an integrally formed sealing mechanism 700 is rotatably mounted on either one (the fixed mold section in the figure) of the fixed and movable mold sections.

In this case as well, the sealing mechanism 700 can be rotated to a position which allows isolation of the internal space part from the outside air at the time of resin sealing/molding the electronic parts, while the sealing mechanism 700 (700a) can be rotated to a position which does not prevent exchange operation of the fixed and movable mold sections at the time of exchanging the fixed and movable mold sections, as in the case of the above-described embodiment.

Therefore, according to such a structure, since the sealing mechanism can be arranged to a position which allows isolation of the internal space part from the outside air by the simple rotation operation, resin sealing/molding of the electronic parts can be carried out in this state, as in the case of the above-described embodiment.

In addition, since the sealing mechanism can be arranged to a position which does not prevent the exchange operation of the fixed and movable mold sections by the simple rotation operation, the exchange operation of the fixed and movable mold sections can be readily carried out in this state.

Figure 6:
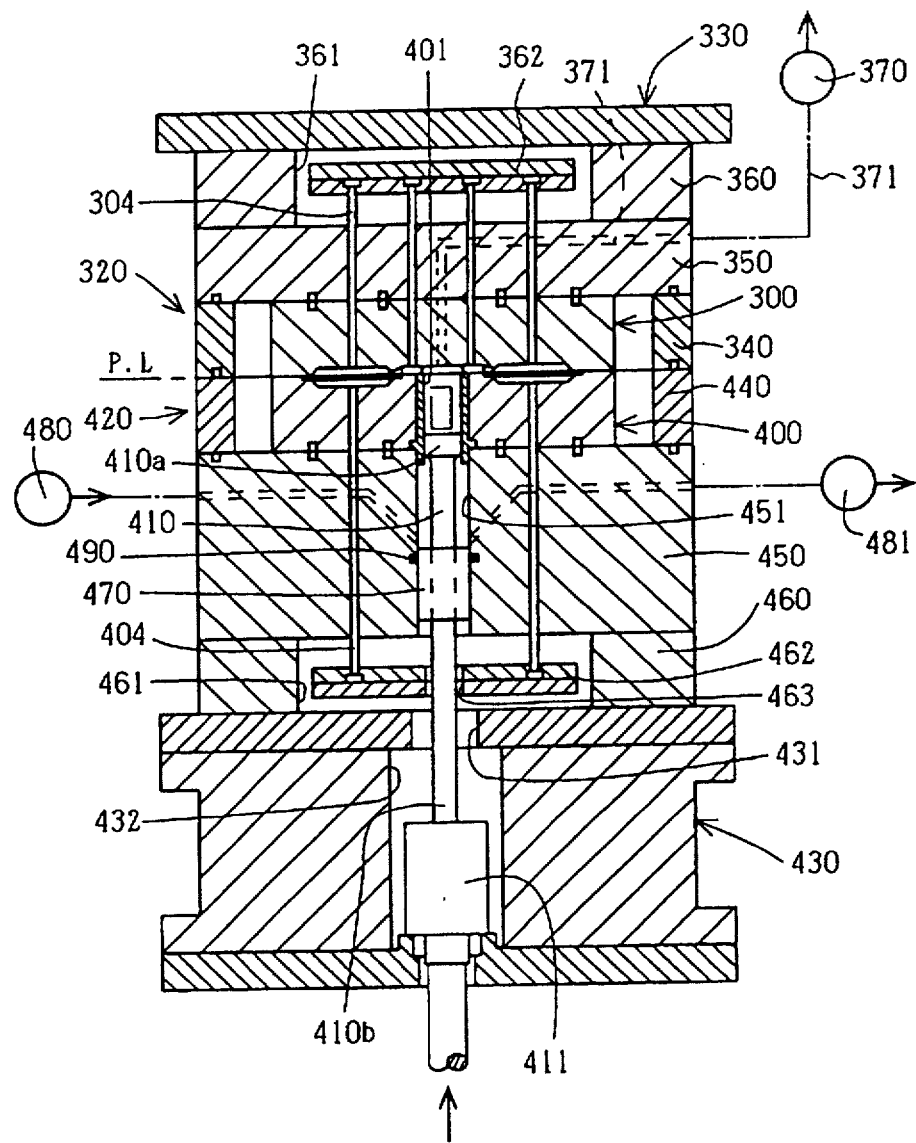
FIG. 6 is a partially fragmented longitudinal sectional view schematically showing an exemplary overall structure of a resin sealing/molding apparatus according to a further embodiment of the present invention.
Figure 7:
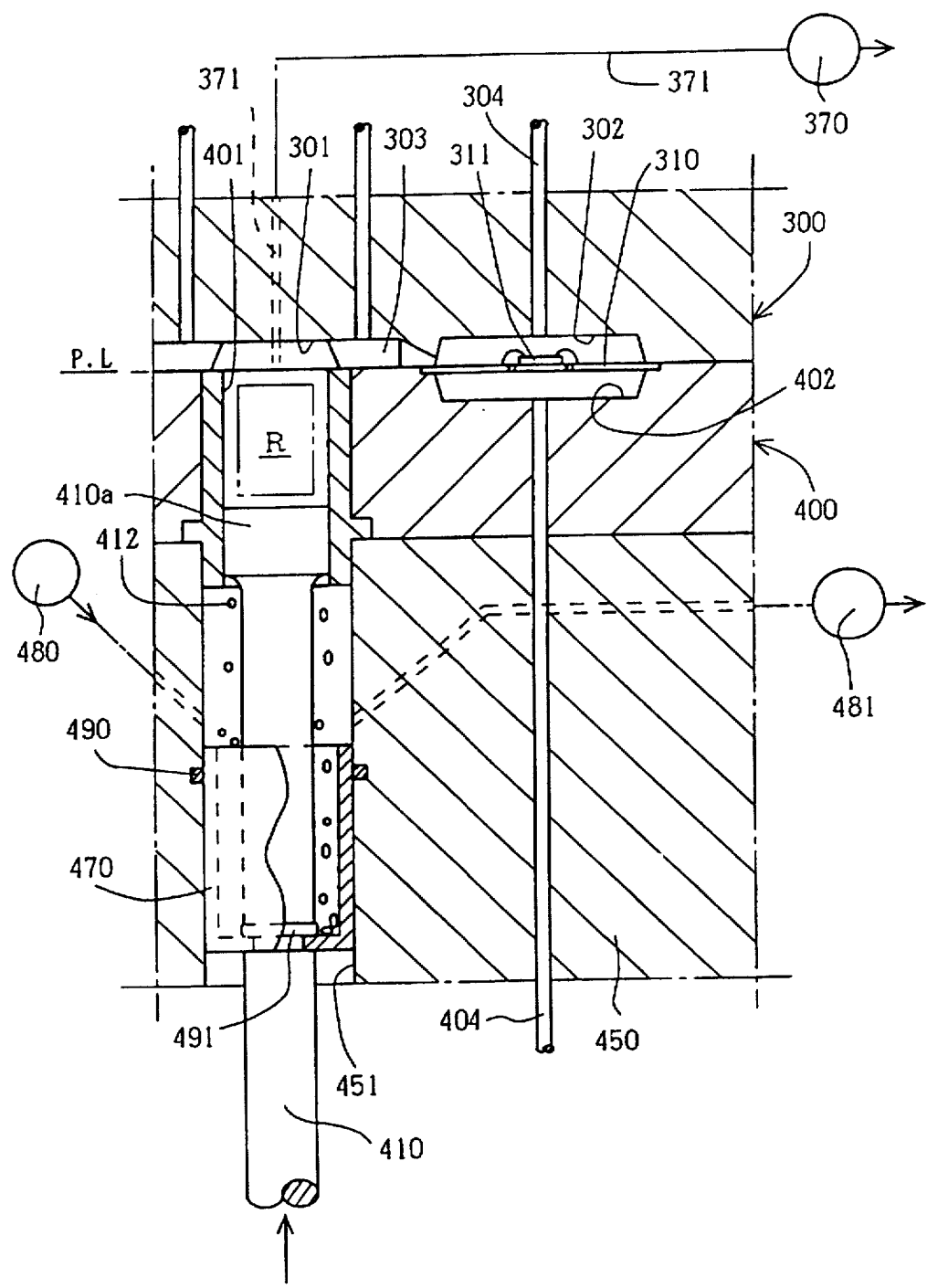
FIG. 7 is a partially fragmented enlarged longitudinal sectional view showing a principal part of a mold of the molding apparatus shown in FIG. 6.

An embodiment shown in FIGS. 6 and 7 is now described.

A resin sealing/molding apparatus shown in FIGS. 6 and 7 carries a mold consisting of a fixed upper mold section 300 and a movable lower mold section 400 which is opposed to the fixed upper mold section 300.

The lower mold section 400 is provided with a single or a plurality of pots 401 for supplying a resin material and a plunger 410 engaged in the pot(s) 401 for pressurizing resin, while a cull part 301 is provided on the upper mold section 300 to be opposed to the pot(s) 401.

Upper and lower cavities 302 and 402 for resin molding are oppositely provided on molding surfaces of the upper and lower mold sections 300 and 400 for engaging/setting electronic parts 311 which are mounted on a lead frame 310, while a resin passage 303 including the cull part 301 is provided between the lower pot(s) 401 and the upper and lower cavities 302 and 402 for transferring a melted resin material.

A resin material R is supplied into the pot(s) 401, so that the heated/melted resin material is pressurized by the plunger 410 and injected/charged into the upper and lower cavities 302 and 402 through the resin passage 303 including the cull part 301.

Therefore, the upper and lower mold sections 300 and 400 are opened after a lapse of a required time which is necessary for hardening the melted resin material, so that a resin molding (mold package) molded in the upper and lower cavities 302 and 402 and the hardened resin in the resin passage 303 are released by ejector pins 304 and 404 provided on the upper and lower mold sections 300 and 400 respectively.

The aforementioned resin sealing/molding apparatus is formed by a mold part 320 for the upper mold section 300, a mold part 420 for the lower mold section 400, a fixed platen 300 mounting the mold part 320 for the upper mold section 300, and a movable platen 430 mounting the mold part 420 for the lower mold section 400.

The upper mold part 320 is formed by an upper air isolation member 340 of an annular form or the like which is provided around the outer side of the upper mold section 300 to enclose the same, an upper mounting plate 350 mounting the upper mold section 300 and the upper air isolation member 340, and an upper spacer block 360 which is provided between the upper mounting plate 350 and the fixed platen 330.

On the other hand, the lower mold part 420 is formed by a lower air isolation member 440 of an annular form or the like which is provided around the outer side of the lower mold section 400 to enclose the same, a lower mounting plate 450 mounting the lower mold section 400 and the lower air isolation member 440, and a lower spacer block 460 which is provided between the lower mounting plate 450 and the movable platen 430.

An upper ejector plate 362 fixing the upper ejector pin 304 is vertically movably arranged in a space 361 which is defined by the upper spacer block 360, while a lower ejector plate 462 fixing the lower ejector pin 404 is vertically movably arranged in a space 461 which is defined by the lower spacer block 460.

It is possible to connect the upper and lower air isolation members 340 and 440 with each other on PL surfaces thereof by upwardly moving the lower mold part 420 and the movable platen 430 and closing the upper and lower mold sections 300 and 400, while isolating at least an internal space part consisting of the pot(s) 401, the resin passage 303 and the cavities 302 and 402 from the outside air from the outer peripheral sides of the upper and lower mold sections 300 and 400 by the air isolation members 340 and 440.

This molding apparatus is further provided with a decompression mechanism 370 for forcibly sucking/discharging air etc. from at least the internal space part, and this decompression mechanism 370 is communicationally connected with at least the internal space part through a vacuum path 371 such as a vacuum hose.

Proper sealing members such as O-rings are arranged on required portions of the resin sealing/molding apparatus shown in FIGS. 6 and 7.

As to the aforementioned plunger 410, its forward end portion (upper end portion) 410a is engaged in the pot(s) 401 through insertion holes 431, 463 and 451 provided in an upper portion of the movable platen 430, the lower ejector plate 462 and the lower mounting plate 450 respectively.

A plunger holder 411 freely engaged with/supporting the plunger 410 is provided on the side of its base end portion 410b, while this plunger holder 411 is arranged in a space 432 of the upper movable platen 430 so that the plunger 410 and the plunger holder 411 are vertically reciprocated by a proper vertical reciprocation mechanism (not shown).

As shown in FIGS. 6 and 7, a storer 470 (storage part) for storing resin dregs 412 falling from a clearance between the pot(s) 401 and the plunger 410 is provided in the insertion hole 451 of the lower mounting plate 450 which is provided on a lower portion of the pot(s) 401 to communicate with the pots 401, while the storer 470 vertically reciprocally slides in the insertion hole 451 of the lower mounting plate 450 integrally with the plunger 410.

In the insertion hole 451 of the lower mounting plate 450, a required number of proper sealing members 490 such as O-rings are provided on required positions for sealing a clearance between the vertically reciprocally sliding storer 470 and the insertion hole 451.

The plunger 410 is provided with a proper sealing member 491 such as an O-ring for sealing a clearance between the storer 470 and the plunger 410.

Namely, at least the internal space part can be isolated from the outside air from the pot(s) 401 side in this resin sealing/molding apparatus.

Therefore, it is possible to reliably prevent the resin dregs 412 from being deposited on an upper portion of the plunger holder 411 by storing the falling resin dregs 412 in the storer 470 not to hinder the vertically reciprocated plunger holder 411, while preventing hindrance of the vertical reciprocation of the plunger 410 by the falling/deposited resin dregs 412, thereby improving the resin pressurizing action of the plunger 410.

As shown in FIGS. 6 and 7, further, an air blowing mechanism 480 for blowing compressed air into the storer 470 and an air discharge mechanism 481 for discharging air from the storer 470 are provided in the insertion hole 451 of the lower mounting plate 450, so that the resin dregs 412 can be automatically discharged from the storer 470 to the exterior of the resin sealing/molding apparatus by forcibly circulating air in the storer 470 by the air blowing mechanism 480 and the air discharge mechanism 481.

Therefore, it is not necessary to remove the resin dregs 412 by decomposing the resin sealing/molding apparatus itself, whereby productivity for products (resin moldings) is improved.

In the embodiment shown in FIGS. 6 and 7, it is possible to employ a structure of forming the storer 470 independently of the plunger 410 and fixing/arranging the independent storer to/in the insertion hole 451 of the lower mounting plate 450.

Proper sealing members such as O-rings are provided between the independent storer and the insertion hole 451 of the lower mounting plate 450, as well as between the independently fixed/arranged storer and the vertically reciprocated plunger 410.

Figure 8:
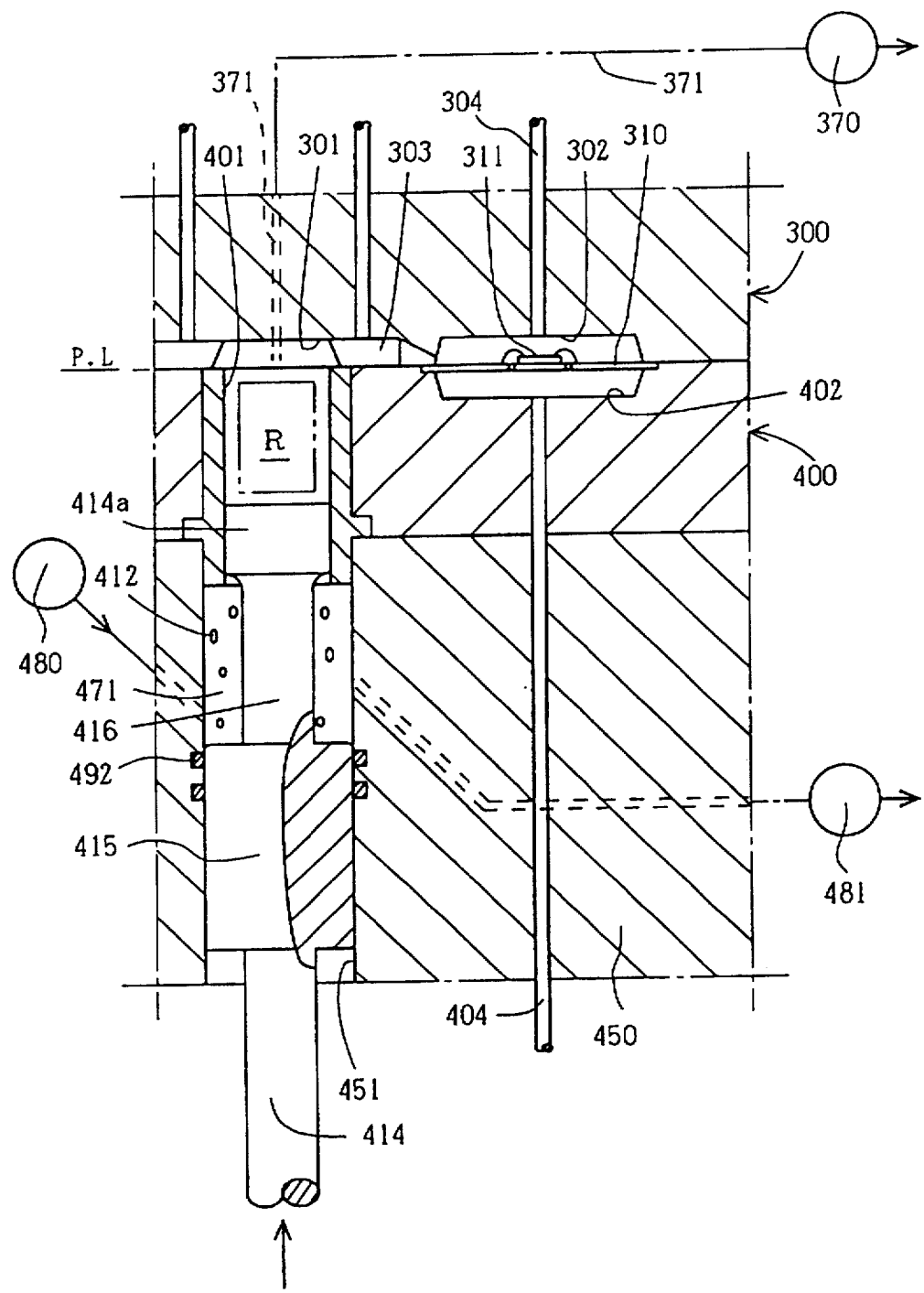
FIG. 8 is a partially fragmented enlarged longitudinal sectional view showing a principal part of a mold in a resin sealing/molding apparatus according to a further embodiment of the present invention.

An embodiment shown in FIG. 8 is now described.

Basic elements for a mold etc. in a resin sealing/molding apparatus shown in FIG. 8 are identical to those shown in FIGS. 6 and 7, and hence these elements are denoted by the same reference numerals.

In upper and lower mold sections 300 and 400 carried on the resin sealing/molding apparatus shown in FIG. 8, a plunger 414 which is engaged in a lower pot 401 is provided with a thick diametral part 415, which is formed to vertically reciprocally slide in an insertion hole 451 of a lower mounting plate 450 communicationally connected with the pot 401 integrally with the plunger 414.

A proper sealing member 492 such as an O-ring is provided in the insertion hole 451 of the lower mounting plate for sealing a clearance between the vertically reciprocally sliding thick diametral part 415 and the insertion hole 451.

On an upper portion of the thick diametral part 415, a storage part 471 (space part) is provided between an outer peripheral wall surface of a thin diametral part 416 of the plunger 414 and an inner peripheral surface of the insertion hole 451 of the lower mounting plate 450 for storing resin dregs 412 falling from a clearance between the pot 401 and a forward end portion (upper end portion) 414a of the plunger 414.

Therefore, at least an internal space part consisting of the pot 401, resin passages 301 and 303 and cavities 302 and 402 can be isolated from the outside air from the pot 401 side, while the falling resin dregs 412 can be stored in the storage part 471.

Referring to FIG. 8, the insertion hole 451 of the lower mounting plate 450 is provided with an air blowing mechanism 480 for blowing compressed air into the storage part 471 and an air discharge mechanism 481 for discharging air from the storage part 471, so that the resin dregs 412 can be automatically discharged from the storage part 471 to the exterior of the resin sealing/molding apparatus similarly to the aforementioned embodiments.

Figure 9:
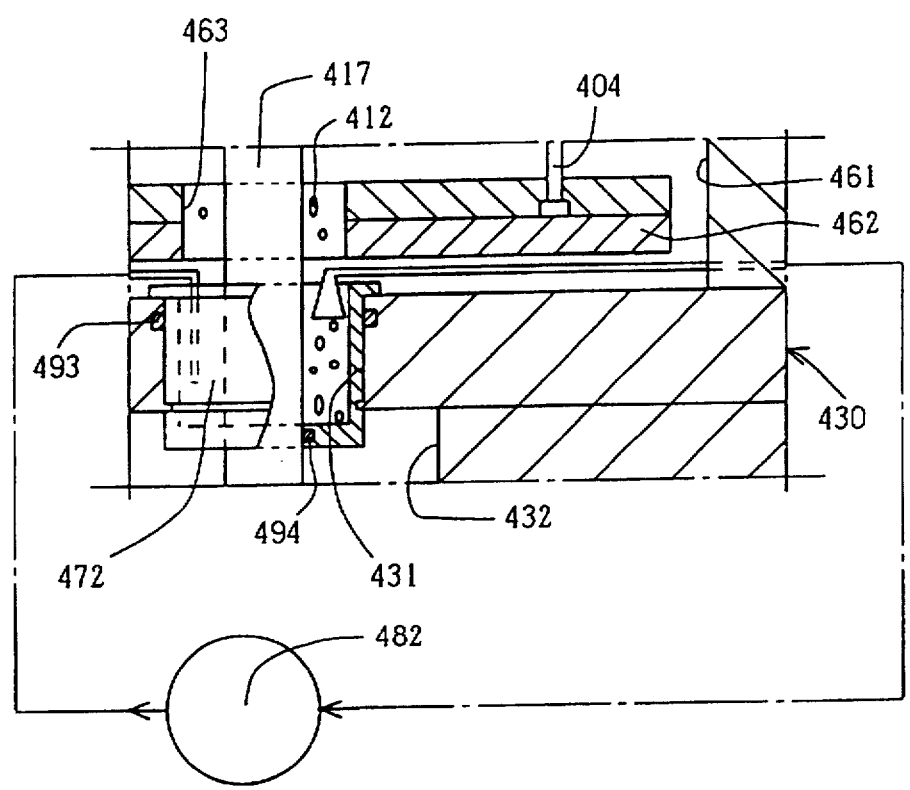
FIG. 9 is a partially fragmented enlarged longitudinal sectional view showing a principal part of a mold in a resin sealing/molding apparatus according to a further embodiment of the present invention.

An embodiment shown in FIG. 9 is now described.

Basic elements for a mold etc. in a resin sealing/molding apparatus shown in FIG. 9 are identical to those shown in FIGS. 6 and 7, and hence these elements are denoted by the same reference numerals.

An upper end of a plunger 417 which is provided on a lower mold section 400 carried on the resin sealing/molding apparatus shown in FIG. 9 is inserted in insertion holes 451, 463 and 431 which are provided in a lower molding plate 450, a lower ejector plate 462 fixing a lower ejector pin 404 and an upper end portion of a movable platen 430 respectively, and engaged in a lower pot 401 (see FIG. 6).

The insertion hole 431 on the upper portion of the movable platen 430 is provided with a storer 472 (storage part) for storing resin dregs 412 falling from a clearance between the pot 401 and the upper end portion of the plunger 417 through the insertion holes 451 and 463 of the lower mounting plate 450 and the lower ejector plate 462 and the like.

A proper sealing member 493 such as an O-ring is provided on the insertion hole 431 on the upper portion of the movable platen 430 for sealing a clearance between the storer 472 and the insertion hole 431, while a proper sealing member 494 such as an O-ring is provided between the plunger 417 and the storer 472.

Therefore, at least an internal space part consisting of the pot 401, resin passages 301 and 303 and cavities 302 and 402 can be isolated from the outside air from the pot 401 side, and the falling resin dregs 412 can be stored in the storer 472.

As shown in FIG. 9, further, the storer 472 is provided with an air blowing/discharge circulation mechanism 482 for circulating air by blowing air into the storer 472 storing the falling resin dregs 412 and discharging the same.

It is possible to automatically discharge the resin dregs 412 from the storer 472 to the exterior of the resin sealing/molding apparatus by circulating air in the storer 472 and the air blowing/discharge circulation mechanism 472 and fractionating the resin dregs 412 contained in the air by a filter provided on the air blowing/discharge circulation mechanism 482.

In the embodiment shown in FIG. 9, it is possible to employ a structure of providing an air blowing mechanism 480 for blowing compressed air into the storer 472 and an air discharge mechanism 481 for discharging air from the storer 472, similarly to the aforementioned embodiments.

In each of the embodiments shown in FIGS. 6, 7 and 8, it is possible to employ a structure of providing the air blowing/discharge circulation mechanism 482.

An embodiment shown in FIGS. 10A to 10C and 11 is now described.

A resin sealing/molding apparatus shown in FIGS. 10A to 10C and 11 carries a mold consisting of a fixed upper mold section 500 and a movable lower mold section 600 which is opposed to the fixed upper mold section 500.

The mold sections 500 and 600 are provided with a single or a plurality of pots 601 for supplying a resin material provided on at least one of the mold sections 500 and 600, a plunger 602 which is engaged with the pot(s) 601 for pressurizing resin, cavities 503 and 603 for resin molding which are oppositely provided on the mold sections 500 and 600 for engaging/setting electronic parts 511 mounted on a lead frame 510, and a resin passage 504 which is provided between the pot(s) 601 and the cavities 503 and 603 for transferring a melted resin material.

Therefore, it is possible to heat/melt a resin material R supplied into the pot(s) 601 when the mold sections 500 and 600 are closed, for pressurizing the melted resin material with the plunger 602 and injecting/charging the same into the cavities 503 and 603 through the resin passage 504, thereby resin-molding the electronic parts 511 which are engaged/set in the cavities 503 and 603.

After a lapse of a required time which is necessary for hardening the melted resin material, a resin molding hardened in the upper and lower cavities 503 and 603 and the resin hardened in the resin passage 504 are released by ejector pins 505 and 605.

A soft air isolation member is engaged around the outer side of one of the mold sections 500 and 600, while a sealing block corresponding to the shape of the soft air isolation member is engaged around the outer side of the other mold section.

As shown in FIGS. 10A to 10C and 11, for example, a skirtlike soft air isolation member 530 is engaged around the outer side of the fixed upper mold section 400, while a sealing block 630 is engaged with the movable lower mold section 500 in correspondence to the skirtlike soft air isolation member 530.

When the mold sections 400 and 500 are closed, the soft air isolation member 530 and the sealing block 630 are connected with each other so that at least an internal space part consisting of the pot(s) 601, the resin passage 504 and the cavities 503 and 603 can be covered from the outer sides of the mold sections 400 and 500 and isolated from the outside air.

Further, a decompression mechanism 520 is provided for forcibly sucking/discharging air remaining in at least the internal space part to the exterior when the mold sections 500 and 600 are closed, while this decompression mechanism 520 is communicationally connected with the internal space part through a vacuum path 521 such as a vacuum hose.

Therefore, it is possible to resin-mold the electronic parts 511 while isolating at least the internal space part from the outside air and setting its interior at a prescribed degree of vacuum.

Figure 10A:
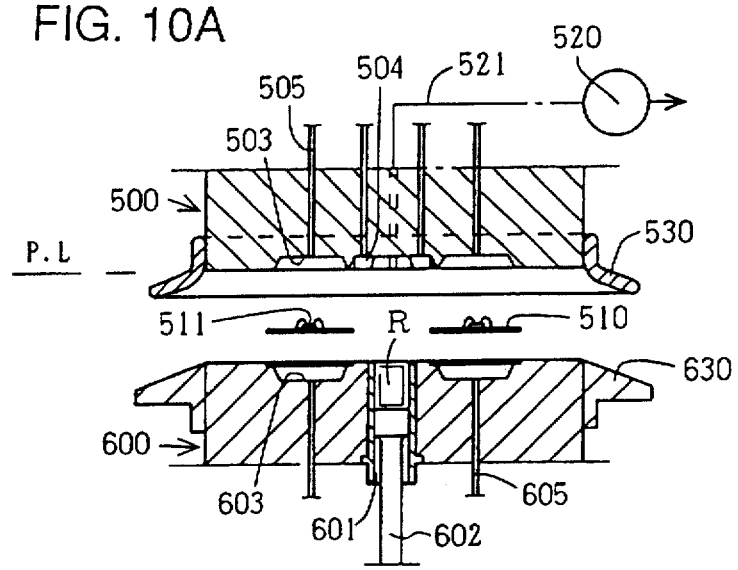
FIGS. 10A, 10B, 10C are longitudinal sectional views schematically showing an open state, an intermediately closed state and a completely closed state of a mold in a resin sealing/molding apparatus according to a further embodiment of the present invention respectively.
Figure 10B:
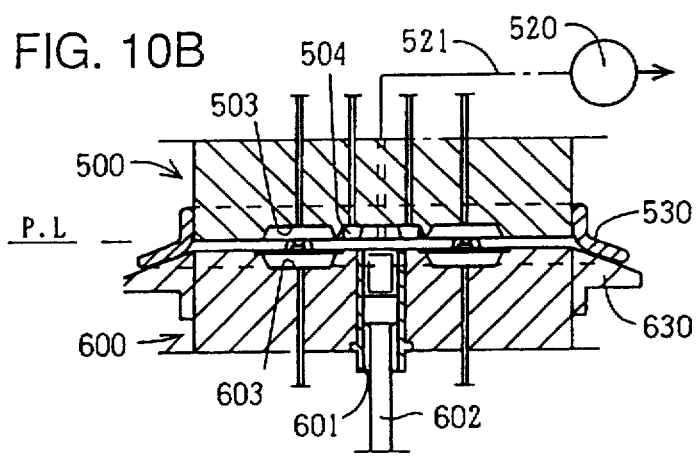

As shown in FIG. 10A, the mold sections 500 and 600 are first opened, and the lead frame 510 mounting the electronic parts 511 is set on a prescribed position of the movable lower mold section 600.

Then, intermediate closure is performed by upwardly moving the movable lower mold section 600 for closing the mold sections 500 and 600 and defining a required space between molding surfaces thereof.

At this time, at least the internal space part can be covered from the outer peripheries of the mold sections 500 and 600 to be isolated from the outside air by connecting the skirtlike soft air isolation member 530 with the sealing block 630, while air remaining at least in the internal space part can be forcibly sucked/discharged by the decompression mechanism 520.

Figure 10C:
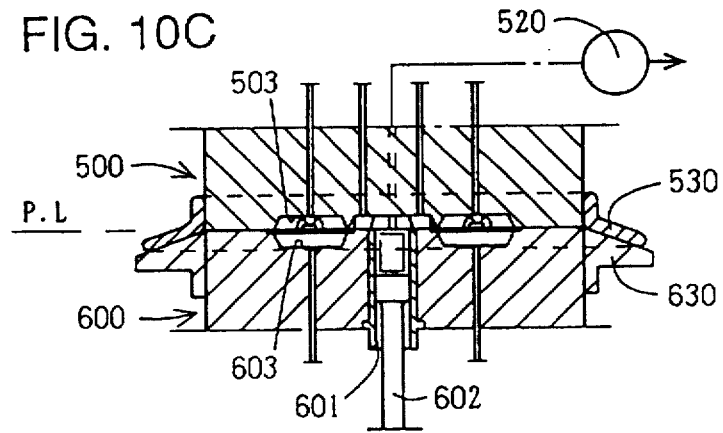

Then, the lower mold section 600 is further upwardly moved for completely closing the upper and lower mold sections 500 and 600, as shown in FIG. 10C.

Thus, it is possible to resin-mold the electronic parts 511 engaged/set in the cavities 503 and 603 by pressurizing the resin material heated/melted in the pot(s) 601 with the plunger 602 while injecting/charging the melted resin material into the cavities 503 and 603 through the resin passage 504.

After hardening of the resin, the mold sections 500 and 600 are opened so that a resin molding or the like can be released by the ejector pins 505 and 605.

The resin sealing/molding apparatus is further provided with a cleaning mechanism 610 advancing into a clearance between the molding surfaces after the resin molding or the like is released and taken out from the mold sections 500 and 600 for removing foreign matters such as resin flashes adhering to the molding surfaces, thereby cleaning the molding surfaces.

Figure 11:
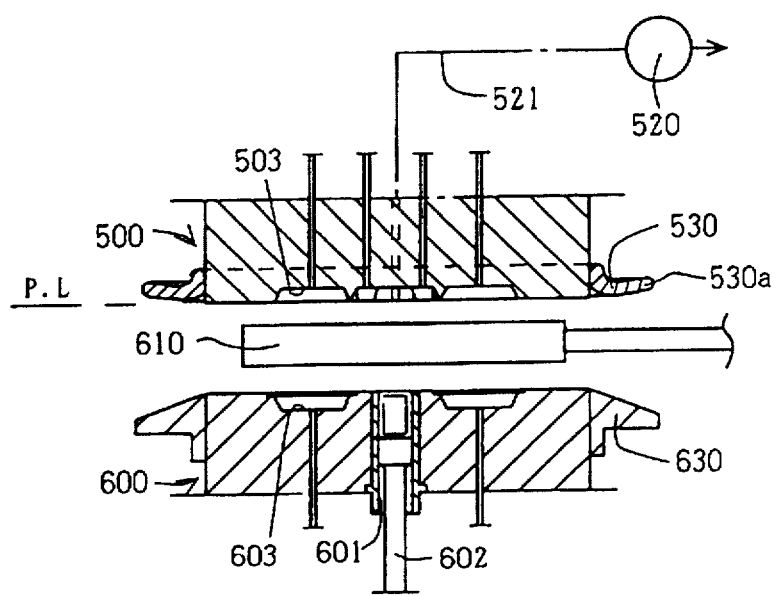
FIG. 11 is a longitudinal sectional view of the mold in the molding apparatus shown in FIGS. 10A to 10C, illustrating a cleaning mechanism advanced between molding surfaces in the open state.

As shown in FIG. 11, a forward end portion 530a of the skirtlike soft air isolation member 530 can be moved to a position not hindering the cleaning mechanism 610. Therefore, the skirtlike soft air isolation member 530 can be prevented from colliding with the cleaning mechanism 610 advancing into the clearance between the molding surfaces for cleaning the same.

In the illustration, the forward end portion 530a of the skirtlike soft air isolation member 530 is positioned above the molding surface (PL surface) of the fixed upper mold section 500.

Namely, it is possible to clean the molding surfaces by moving the forward end portion 530a of the skirtlike soft air isolation member 530 to a position not hindering the cleaning mechanism 610 advancing into the clearance between the mold sections for cleaning while making the cleaning mechanism 610 advance into the clearance.

Therefore, at least the internal space part can be isolated from the outside air by the skirtlike soft air isolation member 530, while the molding surfaces can be readily cleaned by moving the skirtlike soft air isolation member 530 to a position not hindering the cleaning mechanism 610.

Even if the cleaning mechanism 610 collides with the soft air isolation member 530, the cleaning mechanism 610 can be prevented from being damaged or broken since the air isolation member 520 is soft.

Figure 12A:
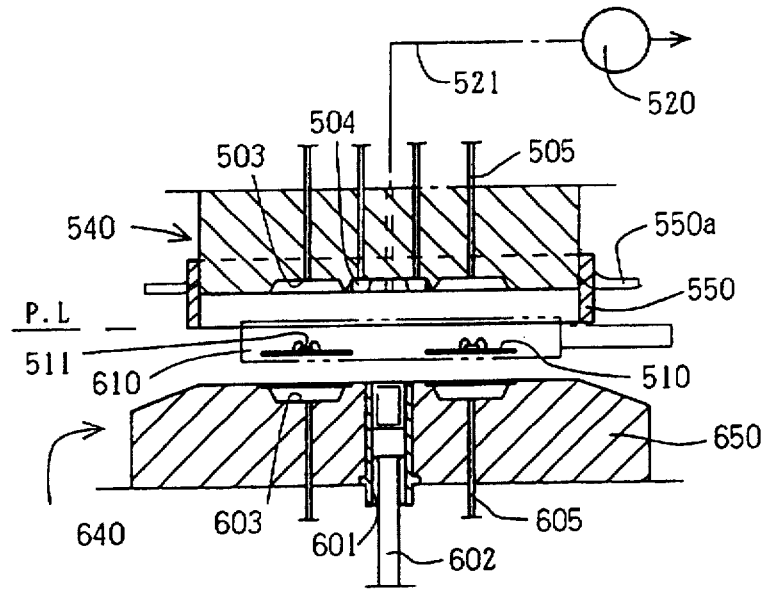
FIGS. 12A and 12B are longitudinal sectional views schematically showing an open state and an intermediately closed state of a mold in a resin sealing/molding apparatus according to a further embodiment of the present invention respectively.
Figure 12B:
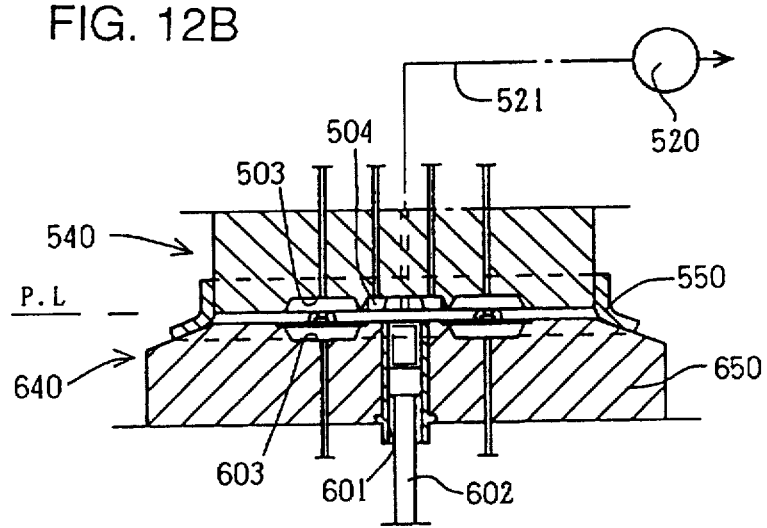

An embodiment shown in FIGS. 12A and 12B is now described.

A molding apparatus shown in FIGS. 12A and 12B is provided with a fixed upper mold section 540, a movable lower mold section 640, a decompression mechanism 520, a cleaning mechanism 610 and the like, similarly to FIGS. 10A to 10C and 11.

A cylindrical soft air isolation member 550 is engaged around the outer side of the fixed upper mold section 540, while a sealing block 650 is provided on the movable lower mold section 640 in correspondence to the cylindrical soft air isolation member 550.

Therefore, it is possible to cover an internal space part consisting at least a pot 601, a resin passage 504 and cavities 503 and 603 for isolating the same from the outside air by connecting the cylindrical soft air isolation member 550 with the sealing block 650 in intermediate closure of the mold sections 540 and 640 for defining a required space between molding surfaces thereof, while air remaining at least in the internal space part can be forcibly sucked/discharged by the decompression mechanism 520, as shown in FIG. 12B.

In opening of the mold sections 540 and 640, on the other hand, it is possible to move a forward end portion 550a of the cylindrical soft air isolation member 550 to a position (upward beyond the molding surfaces in the illustration) not hindering the cleaning mechanism 610 advancing into a clearance between the mold sections for cleaning the same.

Figure 13A:
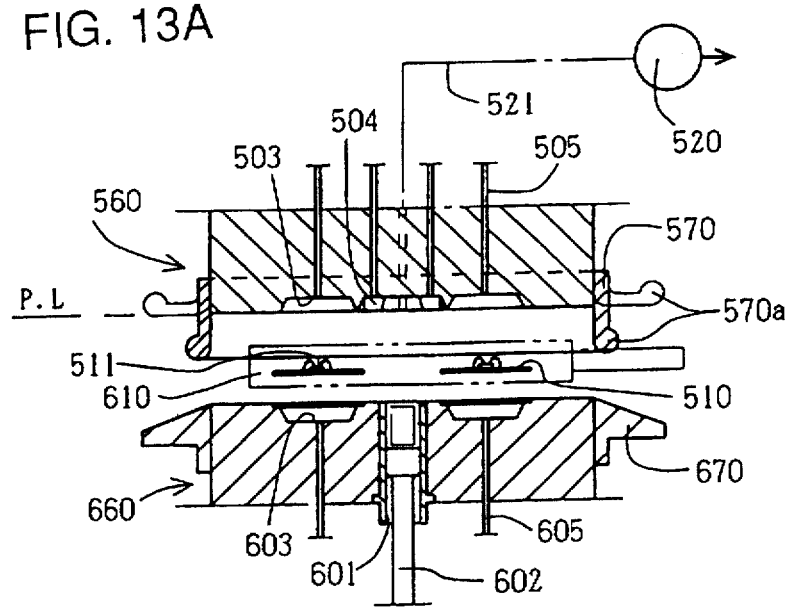
FIGS. 13A and 13B are longitudinal sectional views schematically showing an open state and an intermediately closed state of a mold in a resin sealing/molding apparatus according to a further embodiment of the present invention respectively.
Figure 13B:
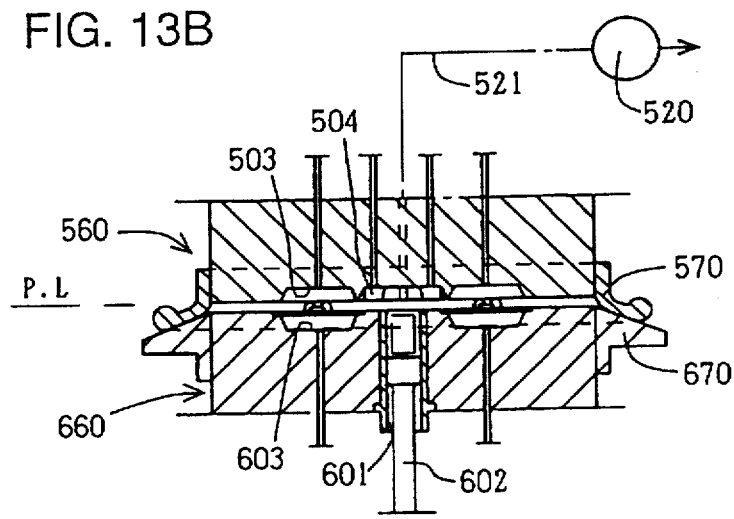
Figure 14:
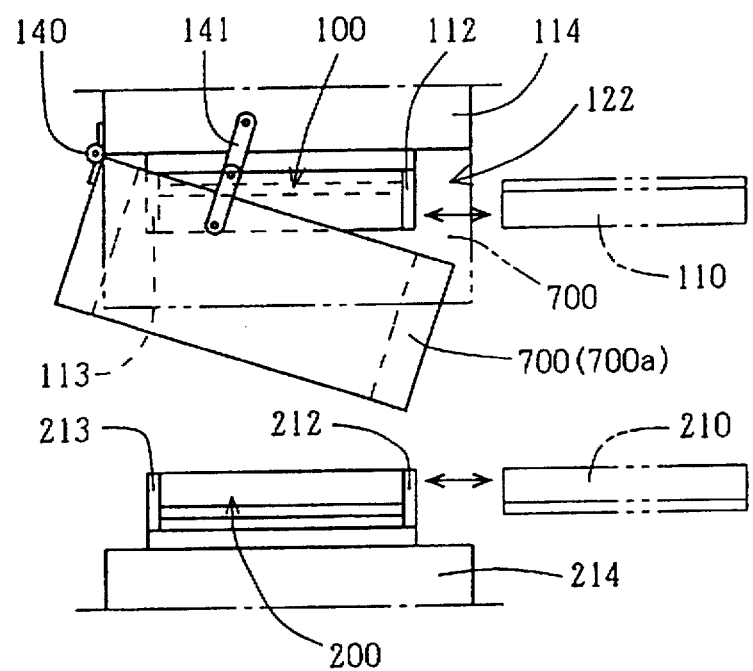
FIG. 14 is a schematic front view showing a sealing mechanism in a resin sealing/molding apparatus of a further embodiment of the present invention, wherein a state at the time of exchanging mold sections is shown.

An embodiment shown in FIGS. 13A and 13B is now described.

A resin sealing/molding apparatus shown in FIGS. 13A and 13B is formed by a fixed upper mold section 560, a movable lower mold section 660, a decompression mechanism 520, a cleaning mechanism 610 and the like, similarly to FIGS. 10A to 10C and 11.

A cylindrical soft air isolation member 570 is engaged around the outer side of the fixed upper mold section 560, while a sealing block 670 is provided on the movable lower mold section 660 in correspondence to the soft air isolation member 570.

Further, a thick part 570a for reinforcement is circumferentially provided on the forward end of the cylindrical soft air isolation member 570, for improving its wear resistance and durability.

In intermediate closure of the upper and lower mold sections 560 and 660 defining a required space between molding surfaces, therefore, at least an internal space part can be covered from the outer peripheral side to be isolated from the outside air by connecting the soft air isolation member 570 with the sealing block 670, while air etc. remaining at least in the internal space can be forcibly sucked/discharged by the decompression mechanism 520, as shown in FIG. 13B.

In opening of the mold sections 560 and 660 shown in FIG. 13A, on the other hand, it is possible to move the forward end portion (thick part 570a) of the cylindrical soft air isolation member 570 to a position not hindering the cleaning mechanism 610 advancing into the clearance between the molding surfaces for cleaning the same, similarly to the aforementioned embodiments.

The present invention is not restricted to the aforementioned embodiments, but the structures can be arbitrarily and properly modified and selected within the scope of the present invention.

According to the present invention, as hereinabove described, it is possible to effectively provide a resin sealing/molding apparatus for electronic parts comprising a proper sealing mechanism for isolating at least an internal space part consisting of a pot, a resin passage and cavities from the outside air.

According to the present invention, further, it is possible to effectively provide a resin sealing/molding apparatus for electronic parts comprising a sealing mechanism, which is suitable for small lot production of various types of products and can readily and quickly exchange a mold.

According to the present invention, further, it is possible to effectively provide a resin sealing/molding apparatus for electronic parts comprising a sealing mechanism, which can prevent a plunger from hindrance of its resin pressurizing action by resin dregs falling from a clearance between a pot and the plunger and isolate at least an internal space consisting of the pot, a resin passage and cavities from the outside air from the pot side.

According to the present invention, further, it is possible to effectively automatically remove resin dregs falling from a clearance between a pot and a plunger in a resin sealing/molding apparatus for electronic parts while improving productivity for products.

According to the present invention, in addition, it is possible to effectively provide a resin sealing/molding apparatus for electronic parts comprising a sealing mechanism which can isolate at least an internal space part comprising a pot, a resin passage and cavities from the outside air and readily clean upper and lower molding surfaces.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A resin sealing/molding apparatus for electronic parts, comprising a fixed mold section, a movable mold section being opposed to said fixed mold section, a pot for supplying a resin material being arranged on at least one of said fixed and movable mold sections, cavities for resin molding being oppositely arranged on said fixed and movable mold sections, a resin passage being provided between said pot and said cavities for transferring a melted resin material, a sealing mechanism for isolating at least an internal space part consisting of said pot, said resin passage and said cavities from outside air, a decompression mechanism for decompressing an air isolation space part being isolated from the outside air through said sealing mechanism, and a vacuum path for communicationally connecting said air isolation space part with said decompression mechanism, wherein said sealing mechanism is rotatably mounted on at least one of said fixed and movable mold sections, and said sealing mechanism is rotated to a position which allows isolation of said internal space part from the outside air at a time of resin sealing/molding the electronic parts, while said sealing mechanism is rotated to a position which does not prevent exchange operation of said fixed and movable mold sections at a time of exchanging said fixed and movable mold sections.

2. A resin sealing/molding apparatus for electronic parts, comprising a fixed mold section, a movable mold section being opposed to said fixed mold section, a pot for supplying a resin material being arranged on at least one of said fixed and movable mold sections, cavities for resin molding being oppositely arranged on said fixed and movable mold sections, a resin passage being provided between said pot and said cavities for transferring a melted resin material, a sealing mechanism for isolating at least an internal space part consisting of said pot, said resin passage and said cavities from outside air at a time of closing said fixed and movable mold sections, a decompression mechanism for decompressing an air isolation space part being isolated from the outside air through said sealing mechanism, and a vacuum path for communicationally connecting said air isolation space part with said decompression mechanism, wherein said sealing mechanism is rotatably mounted on each of said fixed and movable mold sections, and each said sealing mechanism is rotated to a position which allows isolation of the internal space part from the outside air at a time of resin sealing/molding the electronic parts, while each said sealing mechanism is rotated to a position which does not prevent exchanges operation of said fixed and movable mold sections at a time of exchanging said fixed and movable mold sections.

3. A resin sealing/molding apparatus for electronic parts comprising an upper mold section, a lower mold section being opposed to said upper mold section, a pot for supplying a resin material being arranged on at least one of said upper and lower mold sections, cavities for resin molding being oppositely arranged on said upper and lower mold sections, a resin passage being provided between said pot and said cavities for transferring a melted resin material, a plunger for pressurizing resin being engaged in said pot, an upper mounting plate mounting said upper mold section, a lower mounting plate mounting said lower mold section, a sealing mechanism for isolating at least an internal space part consisting of said pot, said resin passage and said cavities from the outside air, a decompression mechanism for decompressing an air isolation space part being formed by said sealing mechanism, and a vacuum path for communicationally connecting said air isolation space part with said decompression mechanism, wherein said upper mold section is formed by an upper base and an upper chase unit being detachably exchanged with respect to said upper base, said lower mold section is formed by a lower base and a lower chase unit being detachably exchanged with respect to said lower base, and said sealing mechanism is formed by an upper air isolation member being provided around the outer side of said upper mold section for enclosing said upper mold section, a lower air isolation member being provided around the outer side of said lower mold section for enclosing said lower mold section, a first sealing member being provided on at least one of said upper air isolation member being mounted on said upper mounting plate and said upper mounting plate for sealing a clearance therebetween, a second sealing member being provided on at least one of said lower air isolation member being mounted on said lower mounting plate and said lower mounting plate for sealing a clearance therebetween, and a third sealing member being provided on at least one of engaging surfaces of said upper and lower air isolation members being defined in engagement thereof, while said upper mounting plate is provided with an upper rotational member for making said upper air isolation member freely rotatable, an upper rotational position regulating member for regulating and fixing the rotational position of said upper air isolation member and a fixture for fixing said upper air isolation member to said upper mounting plate and said lower mounting plate is provided with a lower rotational member for making said lower air isolation member freely rotatable and a lower rotational position regulating member for regulating the rotational position of said lower air isolation member, so that said upper chase unit is exchanged through an upper opening being defined by said upper mounting plate and rotated said upper air isolation member and said lower chase unit is exchanged through a lower opening being defined by said lower mounting plate and rotated said lower air isolation member by releasing said fixture.

4. The resin sealing/molding apparatus for electronic parts in accordance with claim 3, wherein said third sealing member is provided on at least one of parting line surfaces of said upper and lower air isolation members.

5. The resin sealing/molding apparatus for electronic parts in accordance with claim 3, wherein said upper and lower air isolation members are coupled with each other by a coupling member while suspending said lower air isolation member by said coupling member, thereby defining said lower opening.

6. The resin sealing/molding apparatus for electronic parts in accordance with claim 4, wherein said upper and lower air isolation members are coupled with each other by a coupling member while suspending said lower air isolation member by said coupling member, thereby defining said lower opening.

7. The resin sealing/molding apparatus for electronic parts in accordance with claim 4, wherein a hollow sealing member is provided as said third sealing member on at least one of said parting line surfaces of said upper and lower air isolation members.

8. The resin sealing/molding apparatus for electronic parts in accordance with claim 5, wherein a hollow sealing member is provided as said third sealing member on at least one of said parting line surfaces of said upper and lower air isolation members.

* * * * *